United States Patent
Park et al.

(10) Patent No.: US 12,532,524 B2
(45) Date of Patent: Jan. 20, 2026

(54) SEMICONDUCTOR DEVICES

(71) Applicant: SAMSUNG ELECTRONICS CO., LTD., Suwon-si (KR)

(72) Inventors: Beomjin Park, Hwaseong-si (KR); Myunggil Kang, Suwon-si (KR); Dongwon Kim, Seongnam-si (KR); Keunhwi Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 996 days.

(21) Appl. No.: 17/575,856

(22) Filed: Jan. 14, 2022

(65) Prior Publication Data

US 2022/0406919 A1 Dec. 22, 2022

(30) Foreign Application Priority Data

Jun. 18, 2021 (KR) .......................... 10-2021-0079225

(51) Int. Cl.
*H01L 29/66* (2006.01)
*H01L 29/78* (2006.01)
(Continued)

(52) U.S. Cl.
CPC ......... *H10D 64/017* (2025.01); *H10D 30/611* (2025.01); *H10D 64/021* (2025.01)

(58) Field of Classification Search
CPC .. H10D 30/014; H10D 30/024; H10D 30/611; H10D 30/62; H10D 30/6211; H10D 30/6212; H10D 30/6213; H10D 30/6735; H10D 62/118; H10D 62/119; H10D 62/121; H10D 64/015; H10D 64/017; H10D 64/018; H10D 64/021; H10D 84/0158;
(Continued)

(56) References Cited

U.S. PATENT DOCUMENTS 9,620,590 B1 4/2017 Bergendahl et al.
10,211,307 B2 2/2019 Ching et al.
(Continued)

FOREIGN PATENT DOCUMENTS

KR 10-2019-0036773 A 4/2019
KR 10-2020-0136230 A 12/2020

OTHER PUBLICATIONS

Office Action dated Jun. 16, 2025 issued in corresponding to Korean Patent Application No. 10-2021-0079225.

*Primary Examiner* — David C Spalla
(74) *Attorney, Agent, or Firm* — Morgan, Lewis & Bockius LLP

(57) ABSTRACT

A semiconductor device includes: an active region extending on a substrate in a first direction; a plurality of semiconductor layers spaced apart from each other vertically on the active region, including a lower semiconductor layer and an uppermost semiconductor layer disposed above the lower semiconductor layer and having a thickness greater than that of the lower semiconductor layer; a gate structure extending on the substrate in a second direction, perpendicular to the first direction, and including a gate electrode at least partially surrounding each of the plurality of semiconductor layers; a spacer structure disposed on both sidewalls of the gate structure; and source/drain regions disposed on the active region on both sides of the gate structure and contacting the plurality of semiconductor layers.

20 Claims, 23 Drawing Sheets

(51) Int. Cl.
*H10D 30/60* (2025.01)
*H10D 64/01* (2025.01)

(58) Field of Classification Search
CPC . H10D 84/0193; H10D 84/834; H10D 84/853
See application file for complete search history.

(56) References Cited

U.S. PATENT DOCUMENTS

| | | |
|---|---|---|
| 10,651,314 B2 | 5/2020 | Chen et al. |
| 11,289,584 B2 * | 3/2022 | Wu ................ H10D 64/018 |
| 2019/0096996 A1 | 3/2019 | Song et al. |
| 2020/0161297 A1 | 5/2020 | Chen et al. |
| 2020/0381545 A1 | 12/2020 | Chiang et al. |
| 2020/0381547 A1 | 12/2020 | Song et al. |
| 2020/0395482 A1 | 12/2020 | Song et al. |
| 2021/0036122 A1 | 2/2021 | Wong et al. |
| 2021/0313442 A1 | 10/2021 | Suh et al. |
| 2021/0343858 A1 * | 11/2021 | Wang ................ H10D 30/6757 |
| 2022/0037509 A1 * | 2/2022 | Huang ................ H10D 84/013 |
| 2022/0344496 A1 * | 10/2022 | Su .................... H10D 62/116 |
| 2022/0384610 A1 * | 12/2022 | Liu .................... H10D 30/014 |

* cited by examiner

SEMICONDUCTOR DEVICES

CROSS-REFERENCE TO RELATED APPLICATION

This application claims priority under 35 U.S.C. § 119 to Korean Patent Application No. 10-2021-0079225 filed on Jun. 18, 2021 in the Korean Intellectual Property Office, the disclosure of which is incorporated by reference herein in its entirety.

TECHNICAL FIELD

The present disclosure relates to a semiconductor device.

DISCUSSION OF THE RELATED ART

Semiconductor devices are used in electronic devices as general purpose processors, for memory storage, as display drivers, and the like. As demand for high performance, high speed and/or multifunctionality of semiconductor devices increases, the devices are necessarily becoming smaller and more integrated. In the manufacture of semiconductor devices with increased integration, it is necessary to implement patterns having a fine width or a fine separation distance. However, decreasing the widths and separation distances in the design of the semiconductor devices may cause electrical shorts or manufacturing defects in conventional semiconductors. Accordingly, there is a need in the art for new designs with improved electrical characteristics.

SUMMARY

An aspect of the present disclosure is to provide a semiconductor device having improved electrical characteristics. To overcome limitations of operating characteristics due to reductions in the size of a planar metal oxide semiconductor FET (MOSFET), the present disclosure provides a semiconductor device including a FinFET having a channel having a three-dimensional structure.

According to an aspect of the present disclosure, a semiconductor device includes: an active region extending on a substrate in a first direction; a plurality of semiconductor layers spaced apart from each other vertically on the active region, and wherein the plurality of semiconductor layers includes at least one lower semiconductor layer and an uppermost semiconductor layer disposed above the lower semiconductor layer and having a thickness greater than that of the lower semiconductor layer; a gate structure extending on the substrate in a second direction that is perpendicular to the first direction and including a gate electrode at least partially surrounding each of the plurality of semiconductor layers; a spacer structure disposed on both sidewalls of the gate structure; and source/drain regions disposed on the active region on both sides of the gate structure and contacting the plurality of semiconductor layers, wherein each of the plurality of semiconductor layers includes a first portion overlapping the gate structure and second portions disposed on both sides of the first portion and overlapping the spacer structure, and wherein a first width of the first portion in the second direction may be greater than a second width of each of the second portions.

According to an aspect of the present disclosure, a semiconductor device includes: an active region extending on a substrate in a first direction; a plurality of semiconductor layers spaced apart from each other vertically on the active region; a gate structure extending on the substrate in a second direction that is perpendicular to the first direction, wherein the gate structure includes a gate electrode at least partially surrounding each of the plurality of semiconductor layers; and source/drain regions disposed on the active region on opposite sides of the gate structure in the first direction and contacting the plurality of semiconductor layers, wherein each of the plurality of semiconductor layers includes a first surface in contact with the source/drain regions, wherein each of the plurality of semiconductor layers has a first width in the second direction in a region overlapping the gate structure, and wherein the first surface of the plurality of semiconductor layers has a second width that is narrower than the first width in the second direction.

According to an aspect of the present disclosure, a semiconductor device includes: an active region extending on a substrate in a first direction; a plurality of semiconductor layers spaced apart from each other vertically on the active region; a gate structure extending on the substrate in a second direction that is perpendicular to the first direction, wherein the gate structure includes a gate electrode at least partially surrounding each of the plurality of semiconductor layers; a spacer structure disposed on both sidewalls of the gate structure; and source/drain regions disposed on the active region on both sides of the gate structure and contacting the plurality of semiconductor layers, wherein an upper surface of an uppermost semiconductor layer is substantially flat, and wherein an upper surface of a lower semiconductor layer disposed below the uppermost semiconductor layer includes an upper surface protrusion protruding toward the uppermost semiconductor layer.

BRIEF DESCRIPTION OF DRAWINGS

The above and other objects and features of the present disclosure will become apparent by describing in detail embodiments thereof with reference to the accompanying drawings, in which.

DETAILED DESCRIPTION

Figure 1:
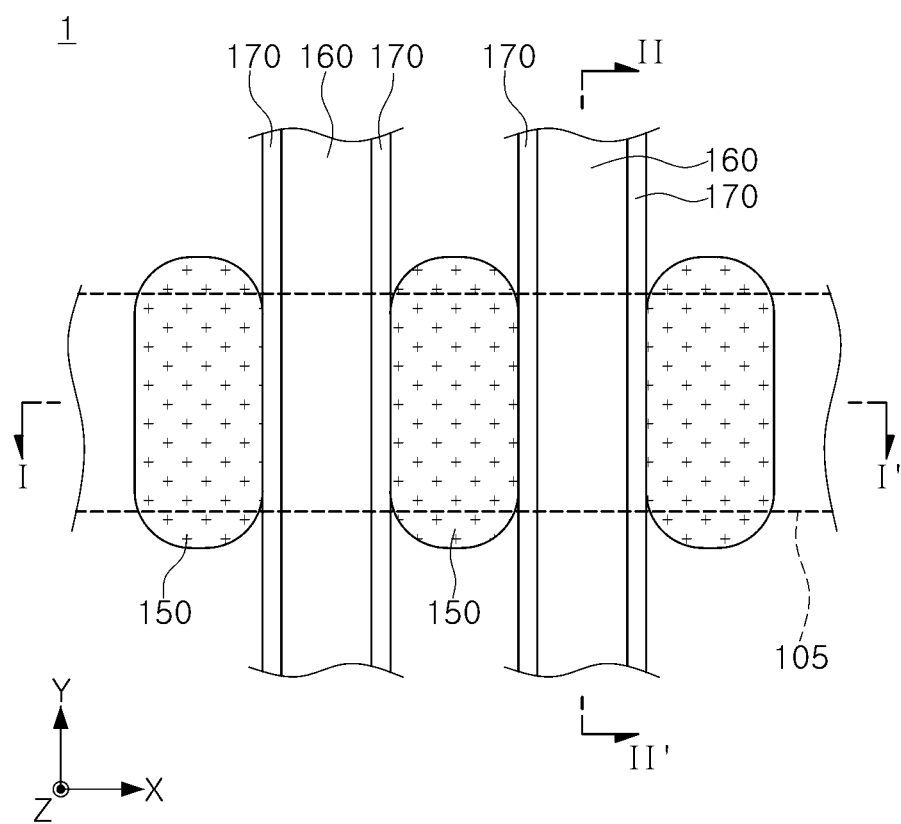
FIG. 1 is a plan view that schematically illustrates a semiconductor device according to example embodiments.

Hereinafter, embodiments of the present disclosure will be described with reference to the accompanying drawings. Like reference symbols in the drawings may denote like elements, and to the extent that a description of an element has been omitted, it may be understood that the element is at least similar to corresponding elements that are described elsewhere in the specification.

Figure 2A:
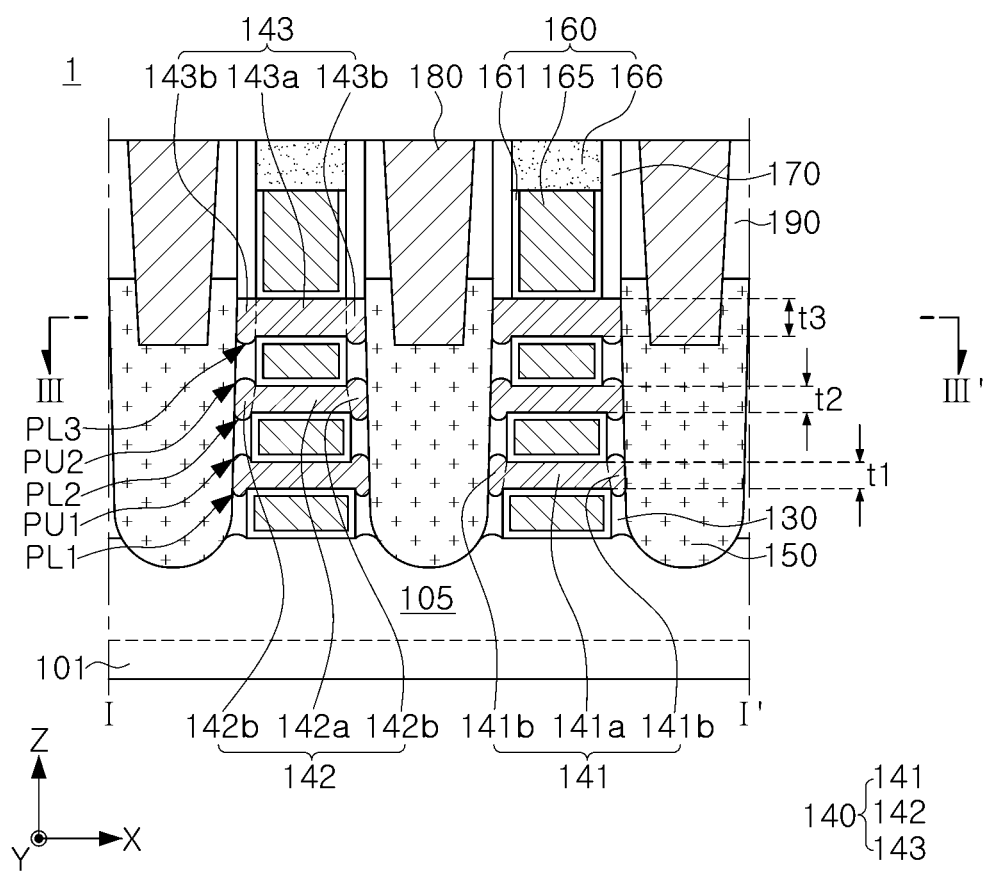
FIGS. 2A and 2B are cross-sectional views that illustrate a semiconductor device according to example embodiments.
Figure 2B:
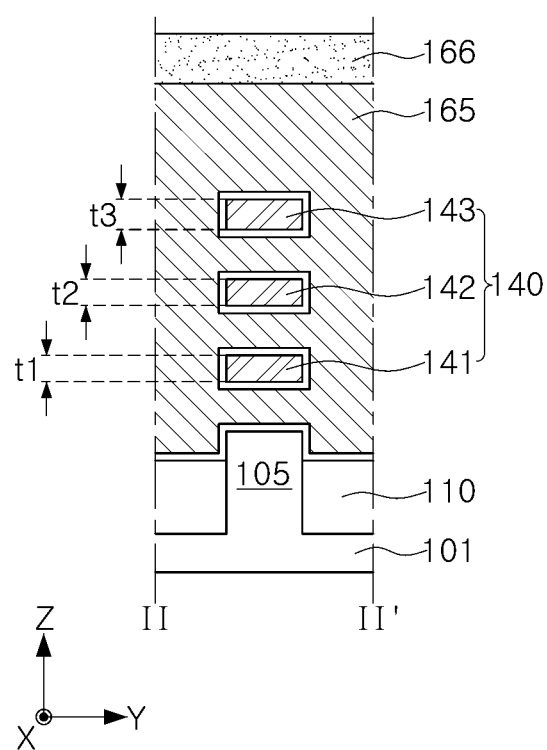
Figure 3:
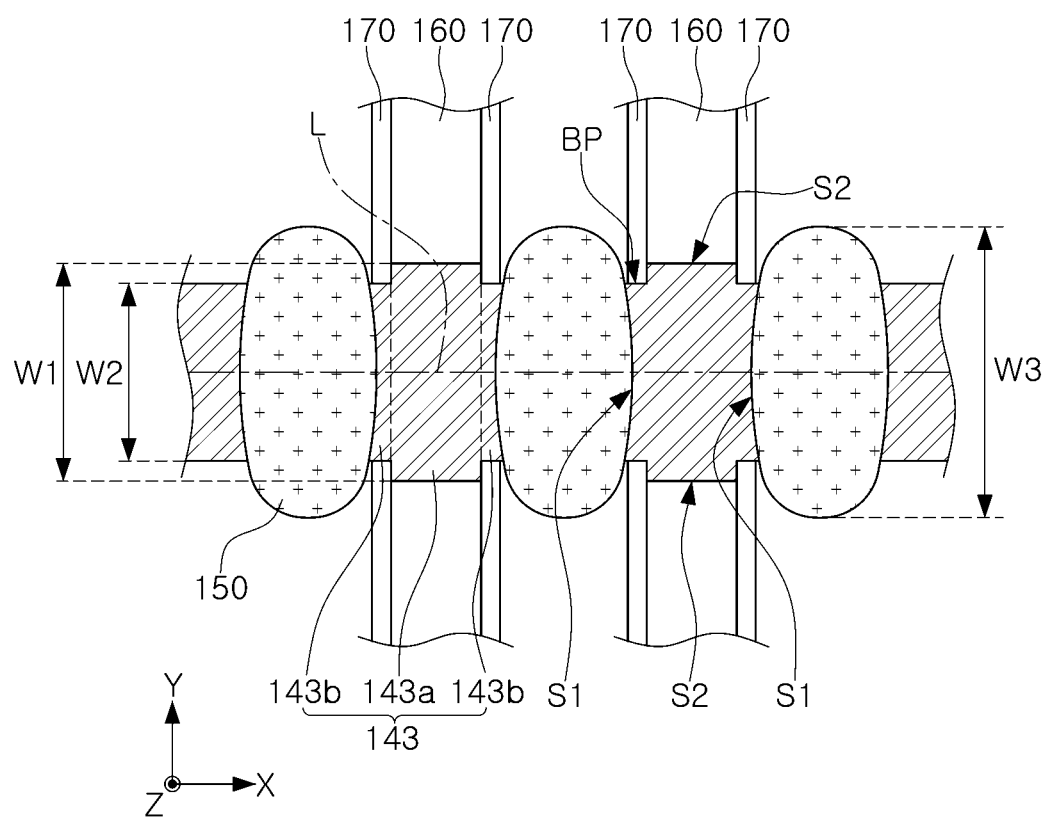
FIG. 3 is a horizontal cross-sectional view that illustrates a semiconductor device according to example embodiments.

FIG. 1 is a plan view that schematically illustrates a semiconductor device according to example embodiments. FIGS. 2A and 2B are cross-sectional views that respectively illustrate a semiconductor device according to example embodiments. FIGS. 2A and 2B illustrate cross-sections of the semiconductor device of FIG. 1 taken along cutting lines I-I' and II-II', respectively. FIG. 3 is a horizontal cross-sectional view that illustrates a semiconductor device according to example embodiments. FIG. 3 illustrates a horizontal cross-section taken along line III-III' of FIG. 2A.

The line III-III' is a cutting line which may cut a semiconductor device 1 along a horizontal surface (an X-Y plane) at a certain height level corresponding to one of a plurality of semiconductor layers 140 of the semiconductor device 1, for example, a third semiconductor layer 143. For example, the line III-III' may hypothetically cut the semiconductor device 1 to form a cross section that provides a new view of the embodiment illustrated in FIG. 2A. Hereinafter, the cut surface of the semiconductor device 1 by the cutting line III-III' will be referred to as a 'horizontal cut surface'. The horizontal cut surface may be understood as a cross-section by cutting the semiconductor device 1 such that a source/drain region 150 is cut along a direction, parallel to an upper surface of a substrate 101.

Referring to FIGS. 1 to 3, the semiconductor device 1 may include a substrate 101, an active region 105 on the substrate 101, a plurality of semiconductor layers 140 disposed spaced apart from each other vertically on the active region 105, source/drain regions 150 in contact with the plurality of semiconductor layers 140, a gate structure 160 extending by intersecting the active region 105, and a spacer structure 170 disposed on both sidewalls of the gate structure 160. The semiconductor device 1 may further include device isolation layers 110, an interlayer insulating layer 190, and contact structures 180 connected to the source/drain regions 150.

In the semiconductor device 1, the active region 105 may have a fin structure, and a gate electrode 165 of the gate structure 160 may be disposed between the active region 105 and the plurality of semiconductor layers 140, disposed between each of the plurality of semiconductor layers 141, 142, and 143, and further disposed above the plurality of semiconductor layers 140.

For example, there may be several gate structures 165 disposed along a vertical direction, e.g. Z-direction. Accordingly, the semiconductor device 1 may include a multi bridge channel FET (MBCFET™) by the plurality of semiconductor layers 140, the source/drain regions 150, and the gate electrode 165.

The substrate 101 may have an upper surface extending in an X-direction and a Y-direction. For example, the substrate 101 may extend across an X-Y plane. The substrate 101 may include a semiconductor material, such as a Group IV semiconductor, a Group III-V compound semiconductor, or a Group II-VI compound semiconductor. For example, the Group IV semiconductor may include silicon (Si), germanium (Ge) or silicon-germanium (SiGe). The substrate 101 may be provided as a bulk wafer, an epitaxial layer, a silicon on insulator (SOI) layer, a semiconductor on insulator (SeOI) layer, or the like.

The active region 105 may be defined as the device isolation layer 110 in the substrate 101, and may extend in a first direction, for example, the X-direction. The active region 105 may have a structure that protrudes from the substrate 101. An upper end of the active region 105 may protrude to a predetermined height from an upper surface of the device isolation layer 110. The active region 105 may be formed as a part of the substrate 101, or may include an epitaxial layer grown from the substrate 101. The active region 105 on the substrate 101 may be partially recessed on both sides of the gate structure 160, and source/drain regions 150 may be disposed on the recessed active region 105. Accordingly, as shown in FIG. 2A, the active region 105 may have a relatively high height below the plurality of semiconductor layers 140 and the gate structure 160, and may have a relatively lower height in the recessed region. According to example embodiments, the active region 105 may include impurities, and at least a portion of the active regions 105 may include impurities of different conductivity types, but is not necessarily limited thereto. A plurality of active regions 105 may be spaced apart from each other in the y-direction.

The device isolation layer 110 may define the active region 105 of the substrate 101. The device isolation layer 110 may be formed by, for example, a shallow trench isolation (STI) process. The device isolation layer 110 may expose upper sidewalls of the active region 105. According to example embodiments, the device isolation layer 110 may include a region that extends deeper into a lower portion of the substrate 101 between the active regions 105. The device isolation layer 110 may have a curved upper surface that has a higher level adjacent to the active region 105, but the shape of the upper surface of the device isolation layer 110 is not necessarily limited thereto. The device isolation layer 110 may be made of an insulating material. The device isolation layer 110 may be, for example, an oxide, a nitride, or a combination thereof.

The plurality of semiconductor layers 140 may include two or more semiconductor layers 140 spaced apart from each other in a direction that is perpendicular to the upper surface of the active region 105, for example, in a Z-direction on the active region 105. The plurality of semiconductor layers 140 may include lower semiconductor layers 141 and/or 142, and/or an uppermost semiconductor layer 143 disposed above the lower semiconductor layers 141 and 142. The plurality of semiconductor layers 140 may include a first semiconductor layer 141, a second semiconductor layer 142 on the first semiconductor layer 141, and/or a third semiconductor layer 143 on the second semiconductor layer 142. The first to third semiconductor layers 141, 142, and 143 may each be connected to the source/drain regions 150, and spaced apart from the upper surface of the active region 105, e.g., in the vertical direction Z-direction.

A thickness t3 of the third semiconductor layer 143 may be greater than a thickness t1 of the first semiconductor layer 141 and greater than a thickness t2 of the second semiconductor layer 142. For example, the thickness t3 of the uppermost semiconductor layer 143 may be greater than the thicknesses t1 and t2 of each of the lower semiconductor layers 141 and 142. In another example embodiment, the thickness t3 of the uppermost semiconductor layer 143 may be substantially equal to each of the thicknesses t1 and t2 of the lower semiconductor layers 141 and 142. In the present disclosure, the thicknesses of the plurality of semiconductor layers 140 may be defined as a maximum thickness or an average thickness of respective components. In an etching process of the sacrificial gate insulating layer (DGI) described with reference to FIG. 10A, by forming the thickness t3 of the uppermost semiconductor layer 143 to be greater than the thicknesses t1 and t2 of the lower semiconductor layers 141 and 142, it is possible to prevent deterioration of electrical characteristics due to a decrease in the thickness of the uppermost semiconductor layer 143.

Each of the plurality of semiconductor layers 141, 142, and 143 may include first portions 141a, 142a, and 143a overlapping the gate structure 160 and second portions 141b, 142b, and 143b disposed on both sides of the respective first portions and overlapping the spacer structure 170.

An upper surface of the third semiconductor layer 143, which is the uppermost semiconductor layer, may be flat as shown in FIG. 2A. A lower surface of the third semiconductor layer 143 may include a protrusion PL3 which protrudes toward the substrate 101. The protrusion PL3 of the third semiconductor layer 143 may protrude toward an internal spacer 130. The protrusion PL3 of the third semiconductor layer 143 may overlap the internal spacer 130 in the Z-direction. For example, the protrusion PL3 of the third semiconductor layer 143 may penetrate the internal spacer 130 in the Z-direction. The protrusions PL3 of the third semiconductor layer 143 may be disposed on both sides of the gate structure 160. A thickness of the second portion 143b of the third semiconductor layer 143 may be greater than a thickness of the first portion 143a of the third semiconductor layer 143.

A lower surface of each of the first and second semiconductor layers 141 and 142 may include lower surface protrusions PL1 and PL2 which protrude toward the substrate 101. An upper surface of each of the first and second semiconductor layers 141 and 142 may include upper surface protrusions PU1 and PU2 which protrude in a direction of the third semiconductor layer 143, for example, a –Z-direction. The lower surface protrusions PL1 and PL2 and the upper surface protrusions PU1 and PU2 of each of the first and second semiconductor layers 141 and 142 may protrude toward the internal spacer layer 130 of the third semiconductor layer 143. The lower surface protrusions PL1 and PL2 and the upper surface protrusions PU1 and PU2 of each of the first and second semiconductor layers 141 and 142 may overlap the internal spacer layer 130 in the Z-direction (e.g., penetrate the internal spacer layer 130 in the Z-direction). The lower surface protrusions PL1 and PL2 of each of the first and second semiconductor layers 141 and 142 may be disposed on both sides of the gate structure 160. The upper surface protrusions PU1 and PU2 of each of the first and second semiconductor layers 141 and 142 may be disposed on both sides of the gate structure 160. Since each of the first and second semiconductor layers 141 and 142 includes lower surface protrusions PL1 and PL2 and upper surface protrusions PU1 and PU2 from both sides, each of the first and second semiconductor layers 141 and 142 may have, for example, a dumbbell shape. A thickness of the second portion 141b of the first semiconductor layer 141 (e.g., a protrusion portion) may be greater than a thickness of the first portion 141a of the first semiconductor layer 141. A thickness of the second portion 142b of the second semiconductor layer 142 (e.g., a protrusion portion) may be greater than a thickness of the first portion 142a of the second semiconductor layer 142.

However, the shape of each of the plurality of semiconductor layers 140 is not necessarily limited to the illustrated shapes in the Figures. For example, the upper surface and lower surface of each of the first to third semiconductor layers 141, 142, and 143 might not include protrusions.

FIG. 3 illustrates a cut surface of a semiconductor 1 that is cut at a height level corresponding to one of a plurality of semiconductor layers 140, for example, a third semiconductor layer 143. However, cut surfaces cut at a height level corresponding to the first and second semiconductor layers 141 and 142 may have the same or similar shape as the cut surface cut at a height level corresponding to a third semiconductor layer 143. In some embodiments, cut surfaces that are cut at lower height levels such as height levels corresponding to the first and second semiconductor layers 141 and 142 may result in smaller cross-sectional areas of the source/drain regions 150. Hereinafter, a description of the first portion 143a and the second portion 143b of the third semiconductor layer 143 in a horizontal cut surface may be equally applied to first portions 141a and 142a and second portions 141b and 142b of the lower semiconductor layers 141 and 142. As shown in FIG. 3, in a horizontal cut surface, the first portion 143a may contact the gate structure 160, and the second portion 143b may contact the spacer structure 170.

As shown in FIG. 3, each of the plurality of semiconductor layers 140 may include a first surface S1 in contact with source/drain regions 150. Each of the second portions 143b may include a first surface S1 in contact with the source/drain regions 150. Each of the plurality of semiconductor layers 140 may be in contact with the gate structure 160 in a horizontal cut surface, and may include second surfaces S2 which are opposite to each other in the y-direction. The first portion 143a may contact the gate structure 160 in a horizontal cut surface, and may include second surfaces S2 opposite to each other in the y-direction. Each of the plurality of semiconductor layers 140 may include bent portions BP connecting each of the first surface S1 and the second surface S2. For example, a bent portion BP may form a corner "notch" between a first surface S1 and a second surface S2.

As shown in FIG. 3, each of the plurality of semiconductor layers 140 may have a first width W1 in the y-direction in a region overlapping the gate structure 160. The first width W1 may be a maximum width of each of the plurality of semiconductor layers 140. In the y-direction, the first surface S1 which is in contact with the source/drain regions 150 may have a second width W2, narrower than the first width W1. In the y-direction, the first width W1 of the first portion 143a may be greater than the second width W2 of the second portion 143b. In the y-direction, a maximum width W3 of the source/drain regions 150 may be greater than the first width W1 and the second width W2.

The first to third semiconductor layers 141, 142, and 143 may have the same or similar width as the active region 105 in the Y-direction. The first to third semiconductor layers 141, 142, and 143 may have the same or similar width as the gate structure 160 in the X-direction.

However, according to example embodiments, the first to third semiconductor layers 141, 142, and 143 may also have a reduced width so that side surfaces thereof are located below the gate structure 160 in the X-direction. In an example embodiment, the first to third semiconductor layers 141, 142, and 143 may have a wider width in the X-direction closer to the upper surface of the substrate 101. For example, a width of the first semiconductor layer 141 may be greater than a width of the second semiconductor layer 142, and the width of the second semiconductor layer 142 may be greater than a width of the third semiconductor layer 143.

The first to third semiconductor layers 141, 142, and 143 may be formed of a semiconductor material, and may include at least one of silicon (Si), silicon germanium (SiGe), and germanium (Ge). The first to third semiconductor layers 141, 142, and 143 may be formed of the same material as the substrate 101, for example. The number and shape of the semiconductor layers 141, 142, and 143 constituting one of the plurality of semiconductor layers 140 may be variously changed in example embodiments.

Source/drain regions 150 may be disposed on the active regions 105, on both sides of the semiconductor layers 140. The source/drain regions 150 may be provided as a source region or a drain region of the transistor. The source/drain region 150 may cover a side surface of each of the first to third semiconductor layers 141, 142, and 143 and may cover (e.g., partially cover) an upper surface of an active region 105 at a lower end of the source/drain region 150. The source/drain region 150 may be disposed by partially recessing an upper portion of the active region 105, but in example embodiments, whether or not it is recessed and the depth of recesses may be variously changed. The source/drain regions 150 may include a semiconductor layer including silicon (Si), and may be formed of an epitaxial layer. The source/drain regions 150 may include a semiconductor layer including silicon (Si), and may be formed of an epitaxial layer. The source/drain regions 150 may include impurities of different types and/or concentrations. For example, the source/drain regions 150 may include n-type doped silicon (Si) and/or p-type doped silicon germanium (SiGe). In an example embodiment, the source/drain region 150 may have a merged shape connected to each other between the active regions 105 adjacent in the y-direction, but is not necessarily limited thereto.

The gate structure 160 may extend in one direction, for example, a Y-direction, by intersecting the active region 105 and the plurality of semiconductor layers 140 above the active region 105 and the plurality of semiconductor layers 140. A channel region of transistors may be formed in the active region 105 and the plurality of semiconductor layers 140, intersecting the gate structure 160. The gate structure 160 may include a gate electrode 165, a gate dielectric layer 161, and a gate capping layer 166 on an upper surface of the gate electrode 165. A lower surface of the gate structure 160 may contact the third semiconductor layer 143, an uppermost semiconductor layer. For example, a lower surface of the gate structure 160 may be entirely in contact with the third semiconductor layer 143. In an etching process described with reference to FIG. 10A, since a sidewall of the sacrificial gate insulating layer DGI is formed so as not to be recessed inwardly from a sidewall of the sacrificial gate layer DGL, the spacer structure 170 might not be disposed between the gate structure 160 and the third semiconductor layer 143. Accordingly, deterioration of electrical characteristics of the transistor including the gate structure 160 and the plurality of semiconductor layers 140 may be prevented.

The gate dielectric layer 161 may be disposed between the active region 105 and the gate electrode 165 and between the plurality of semiconductor layers 140 and the gate electrode 165, and may cover at least a portion of the surfaces of the gate electrode 165. For example, the gate dielectric layer 161 may surround all surfaces except the uppermost surface of the gate electrode 165. The gate dielectric layer 161 may extend between the gate electrode 165 and the spacer structure 170, but is not necessarily limited thereto.

The gate electrode 165 may extend above the plurality of semiconductor layers 140 while filling a space between the plurality of semiconductor layers 140 above the active region 105. The gate electrode 165 may be spaced apart from the plurality of semiconductor layers 140 by the gate dielectric layer 161.

The gate electrode 165 may include a conductive material, and may include, for example, a metal nitride such as a titanium nitride (TiN), a tantalum nitride (TaN), or a tungsten nitride (WN), and/or a metal material such as aluminum (Al), tungsten (W), molybdenum (Mo), or the like, or a semiconductor material such as doped polysilicon. In an example embodiment, the gate electrodes 165 may include two or more multilayer structures.

The spacer structure 170 may be disposed on both surfaces of the gate electrode 165 and may extend in a Z-direction, perpendicular to an upper surface of the substrate 101. An outer side surface of the spacer structure 170 is illustrated as being a straight line, but is not necessarily limited thereto. For example, the spacer structure 170 may include a portion having a curved outer side surface so that a width of an upper portion of each of the spacer structures 170 is narrower than a width of a lower portion thereof. The spacer structure 170 may insulate the source/drain regions 150 from the gate electrodes 165. The spacer structure 170 may have a multi-layer structure according to example embodiments. The spacer structure 170 may be comprised of oxides, nitrides, and oxynitrides.

As shown in FIG. 3, the spacer structure 170 may be in contact with second portions 143b in a horizontal cross-section. The spacer structure 170 may contact the bent portions BP of the plurality of semiconductor layers 140. In the horizontal cut surface, a distance between portions of the cut spacer structure 170 (e.g., a distance in the x-direction) may be less than a distance between portions of the cut gate structure 160. A surface in which the spacer structure 170 and the plurality of semiconductor layers 140 contact may be disposed closer to a center line L of the plurality of semiconductor layers 140 in the Y-direction than the second surface S2 of the plurality of semiconductor layers 140.

The gate capping layer 166 may be disposed above the gate electrode 165. The gate capping layer 166 may extend in a second direction, for example, a Y-direction along an upper surface of the gate electrode 165. Side surfaces of the gate capping layer 166 may be surrounded by the spacer structure 170. The upper surface of the gate capping layer 166 may be substantially coplanar with the upper surface of the spacer structure 170, but is not necessarily limited thereto. The gate capping layer 166 may be formed of oxides, nitrides, and oxynitrides, and specifically, may include at least one of SiO, SiN, SiCN, SiOC, SiON, and SiOCN.

The internal spacer layers 130 may be disposed in parallel with the gate electrode 165 between the plurality of semiconductor layers 140. The internal spacer layers 130 may be disposed on both sides of the gate structure 160 in a first direction, for example, an x-direction. The internal spacer layers 130 may be disposed on a lower surface of each of the first to third semiconductor layers 141, 142, and 143. As shown in FIG. 2A, the internal spacer 130 may include portions that are further recessed from an upper surface of the gate structure 160. The gate electrode 165 may be spaced apart from the source/drain regions 150 by the internal spacer layers 130 to be electrically isolated from each other below the third semiconductor layer 143. The internal spacer layers 130 may have a shape in which a side surface facing the gate electrode 165 is convexly rounded inwardly from the gate electrode 165, but is not necessarily limited thereto. The internal spacer layers 130 may be formed of oxides, nitrides, and oxynitrides. In some example embodiments, the internal spacer structures 170 may be omitted.

A contact structure 180 may be connected to the source/drain regions 150 through an interlayer insulating layer 190, and may apply an electrical signal to the source/drain regions 150. The contact structure 180 may have an inclined side surface in which a width of a lower portion becomes narrower than a width of an upper portion thereof according to an aspect ratio, but is not necessarily limited thereto. The contact structure 180 may extend from above, for example, lower than the third semiconductor layer 143. For example, the contact structure 180 may extend to a height corresponding to the upper surface of the second semiconductor layer 142. In example embodiments, the contact structure 180 may contact along upper surfaces of the source/drain regions 150 without recessing the source/drain regions 150. The contact structure 180 may include, for example, a metal nitride such as titanium nitride (TiN), tantalum nitride (TaN), or tungsten nitride (WN), and/or a metal material such as aluminum (Al), tungsten (W), or molybdenum (Mo), or the like. In example embodiments, the contact structure 180 may further include a barrier metal layer disposed along an outer side surface and/or a metal-semiconductor compound layer disposed in a region in contact with the source/drain regions 150. The metal-semiconductor compound layer may be, for example, a metal silicide layer.

The interlayer insulating layer 190 may at least partially cover the source/drain regions 150, the gate structures 160, and the spacer structure 170, and to cover the device isolation layer 110. The interlayer insulating layer 190 may include at least one of a silicon oxide, a low-k material, a silicon nitride, and a silicon oxynitride.

Hereinafter, similar components as described above with reference to FIGS. 1 to 3 may be repeated, and redundant description thereof may be omitted.

Figure 4:
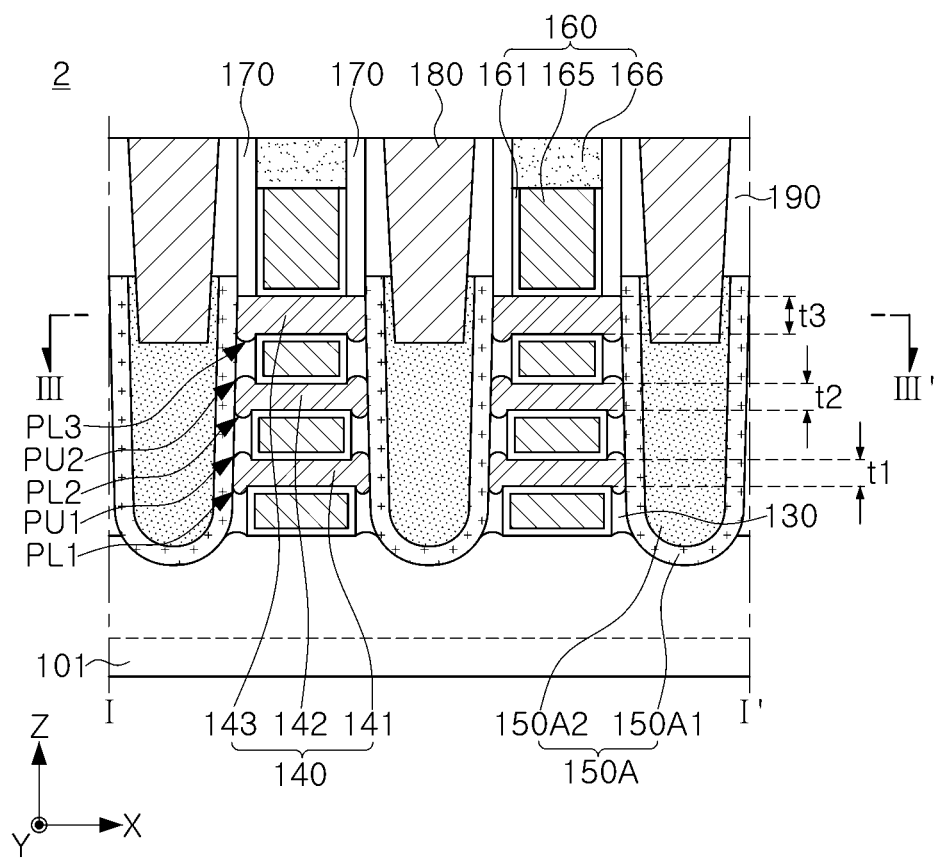
FIG. 4 is a cross-sectional view that illustrates a semiconductor device according to example embodiments.
Figure 5:
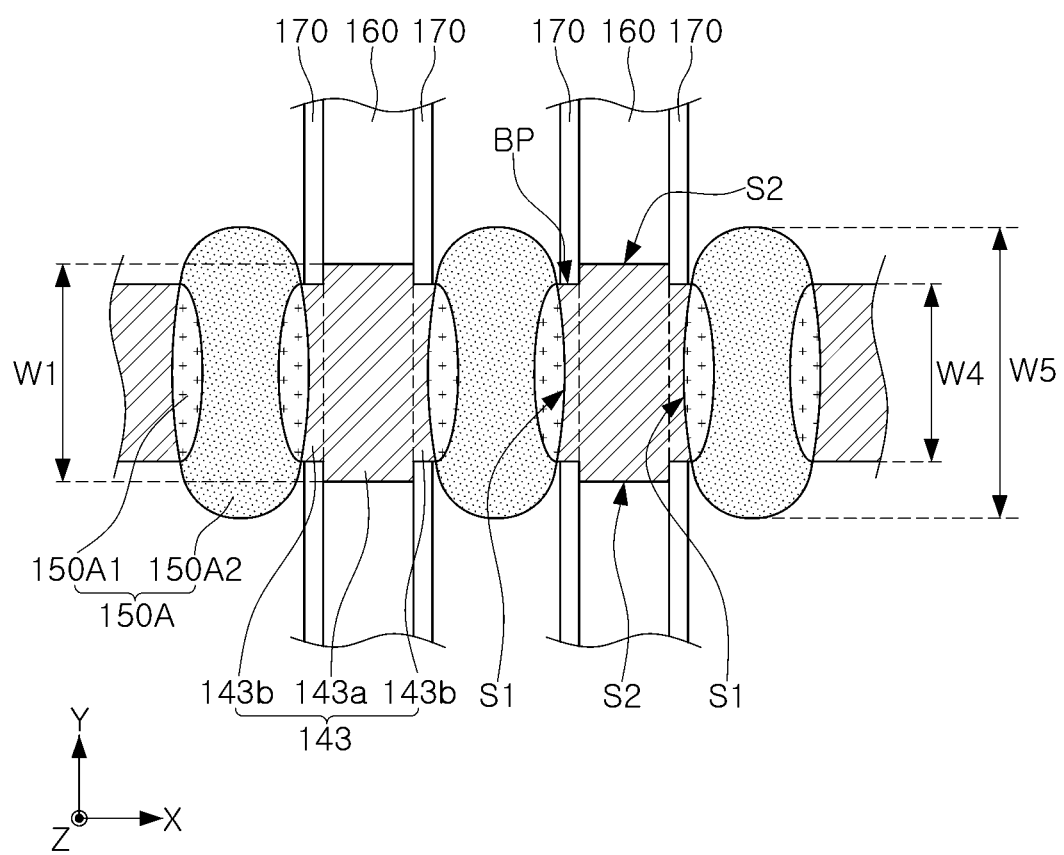
FIG. 5 is a horizontal cross-sectional view that illustrates a semiconductor device according to example embodiments.

FIG. 4 is a cross-sectional view that illustrates a semiconductor device according to example embodiments. FIG. 4 illustrates a cross-section of a semiconductor device 2, corresponding to the cross-section taken along the cutting line I-I' of FIG. 1, similar to the embodiment illustrated in FIG. 2A. FIG. 5 is a horizontal cross-sectional view of a semiconductor device according to example embodiments. FIG. 5 illustrates a horizontal cross-section taken along line III-III' of FIG. 4.

Referring to FIGS. 4 and 5, in a semiconductor device 2, source/drain regions 150A may include a plurality of epitaxial layers. For example, the source/drain regions 150A may include a first epitaxial layer 150A1 and a second epitaxial layer 150A2 disposed on the first epitaxial layer 150A1. The first epitaxial layer 150A1 may directly contact respective side surfaces of the plurality of semiconductor layers 140. In a y-direction, a minimum width W4 of the first epitaxial layer 150A1 may be less than a maximum width W1 of the third semiconductor layer 143. In the y-direction, a maximum width W5 of the second epitaxial layer 150A2 may be greater than the maximum width W1 of the third semiconductor layer 143. The first epitaxial layer 150A1 and the second epitaxial layer 150A2 may have different doping elements and/or doping concentrations.

Figure 6:
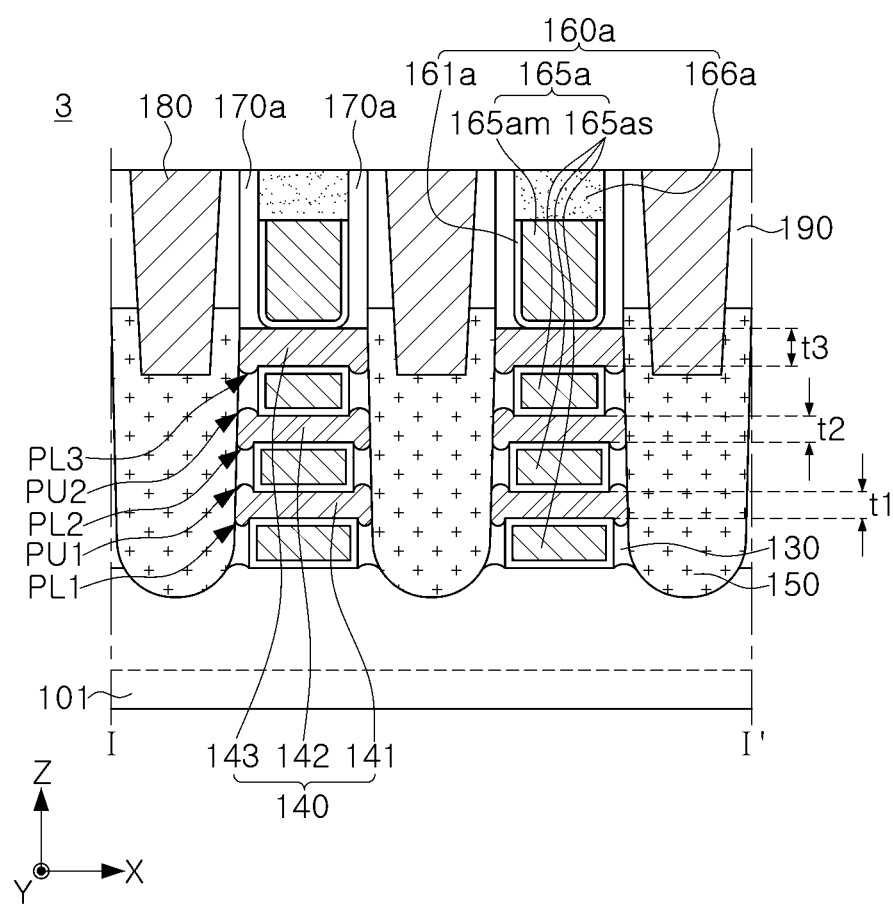
FIG. 6 is a cross-sectional view that illustrates a semiconductor device according to example embodiments.

FIG. 6 is a cross-sectional view that illustrates a semiconductor device according to example embodiments. FIG. 6 illustrates a cross-section of an embodiment of a semiconductor device 3, corresponding to the cross-section taken along the cutting line I-I' of FIG. 1.

Referring to FIG. 6, a modified example embodiment of a gate structure 160a and a spacer structure 170a is illustrated in a semiconductor device 3.

In an example embodiment, the spacer structure 170a may be disposed on both side surfaces of the gate electrode 165a, and may include a portion disposed between the gate structure 160a and the third semiconductor layer 143. A bottom portion of the spacer structure 170a may extend in a horizontal direction and be disposed on an upper surface of the third semiconductor layer 143. At least a portion of the bottom portion of the spacer structure 170a may be disposed between the gate structure 160 and the third semiconductor layer 143. At least a portion of the bottom portion of the spacer structure 170a may be disposed between a gate dielectric layer 161a and the third semiconductor layer 143.

The gate structure 160a may include a gate electrode 165a, a gate dielectric layer 161a, and a gate capping layer 166a disposed on an upper surface of the gate electrode 165a. In an example embodiment, since a spacer structure 170 is disposed between a lower surface of the gate structure 160a and the third semiconductor layer 143, the lower surface of the gate structure 160a might not be entirely in contact with the third semiconductor layer 143.

The gate electrode 165a may include a main gate portion 165am and a plurality of sub-gate portions 165as. The main gate portion 165am may at least partially cover an upper surface of the third semiconductor layer 143, e.g., an uppermost semiconductor layer. The plurality of sub-gate portions 165as may be disposed between the active region 105 and the first semiconductor layer 141 and between each of the plurality of semiconductor layers 140. The main gate portion 165am may be disposed on the upper surface of the third semiconductor layer 143, and may be connected to the plurality of sub-gate portions 165as.

The gate dielectric layer 161a may be disposed between the active region 105 and the sub-gate portion 165as and between the plurality of semiconductor layers 140 and the sub-gate portion 165as, and may cover a portion of the main gate portion 165am. For example, the gate dielectric layer 161a may surround all surfaces except a top surface of the main gate portion 165am.

In an example embodiment, the main gate portion 165am may have a curved shape in a bottom portion. The main gate portion 165am may have a rounded shape at the bottom thereof. In an example embodiment, a portion of the spacer structure 170 may be disposed between the gate dielectric layer 161a and the third semiconductor layer 143. In an example embodiment, the gate dielectric layer 161a may have a round shape under the main gate portion 165am.

Figure 7:
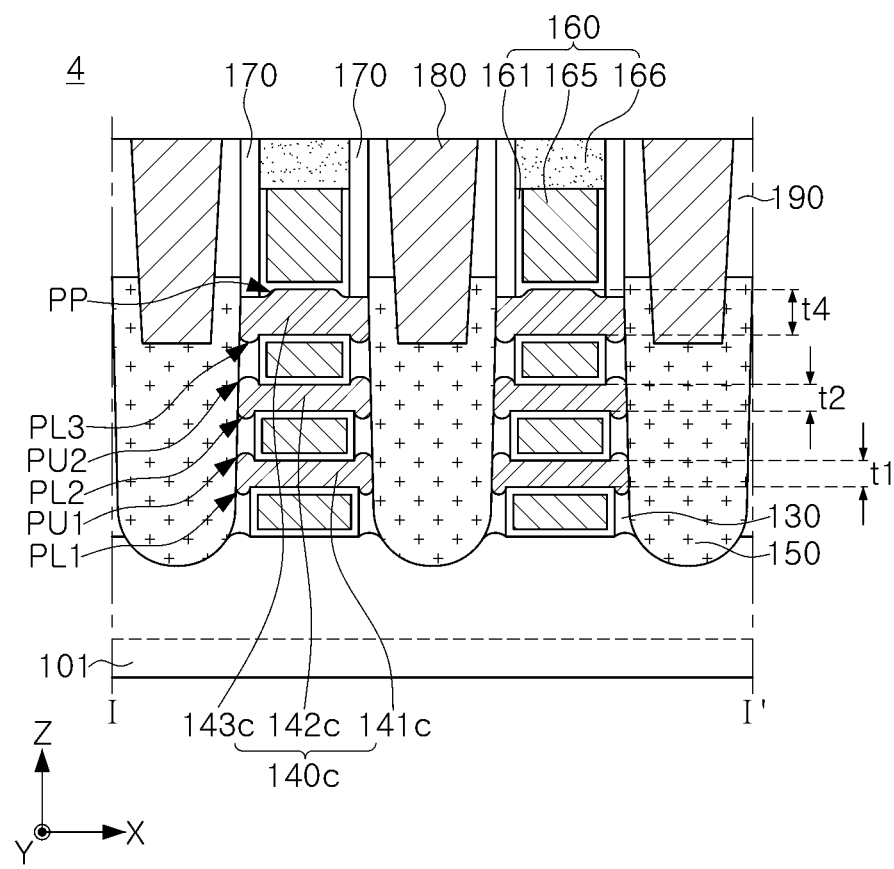
FIG. 7 is a cross-sectional view that illustrates a semiconductor device according to example embodiments.

FIG. 7 is a cross-sectional view that illustrates a semiconductor device according to example embodiments. FIG. 7 illustrates a cross-section corresponding to the cross-section taken along the cutting line I-I' of FIG. 1.

Referring to FIG. 7, in a semiconductor device 4, a modified embodiment of a third semiconductor layer 143c is illustrated in a plurality of semiconductor layers 140c. The plurality of semiconductor layers 140c may include the lower semiconductor layer(s) 141c and/or 142c and an uppermost semiconductor layer 143c disposed above the lower semiconductor layers 141c and 142c. The plurality of semiconductor layers 140c may include a first semiconductor layer 141c, a second semiconductor layer 142c on the first semiconductor layer 141c, and a third semiconductor layer 143c on the second semiconductor layer 142c.

A thickness t4 of the third semiconductor layer 143c may be greater than a thickness t1 of the first semiconductor layer 141c and greater than a thickness t2 of the second semiconductor layer 142c. For example, the thickness t4 of the uppermost semiconductor layer 143c may be greater than the thicknesses t1 and t2 of the lower semiconductor layers 141c and 142c.

In an example embodiment, an upper surface of the third semiconductor layer 143c, e.g. an uppermost semiconductor layer, may include a portion that is higher than a lower surface of the spacer structure 170. For example, an upper surface of the third semiconductor layer 143c may include an upper surface protrusion PP protruding in a direction opposite to the substrate 101, for example, in a —Z-direction. The upper surface protrusion PP of the third semiconductor layer 143c may be disposed in a region that overlaps the gate structure 160. The upper surface protrusion PP of the third semiconductor layer 143c may contact the gate structure 160. In an example embodiment, an upper surface portion of the third semiconductor layer 143c that is more concave than the upper surface protrusion PP may contact the spacer structure 170. A lower surface of the third semiconductor layer 143c may include a protrusion PL3 that protrudes toward the substrate 101. The protrusion PL3 of the third semiconductor layer 143c may protrude toward the internal spacer layer 130. The protrusion PL3 of the third semiconductor layer 143c may overlap the internal spacer layer 130 in the Z-direction. The protrusion PL3 of the third semiconductor layer 143c may be disposed on both sides of the gate structure 160.

FIGS. 8A to 14C are diagrams that illustrate a process sequence of a method of manufacturing a semiconductor device according to example embodiments. FIGS. 8A to 14C illustrate an example embodiment of a manufacturing method for manufacturing the semiconductor device of FIGS. 1 to 3.

Figure 8A:
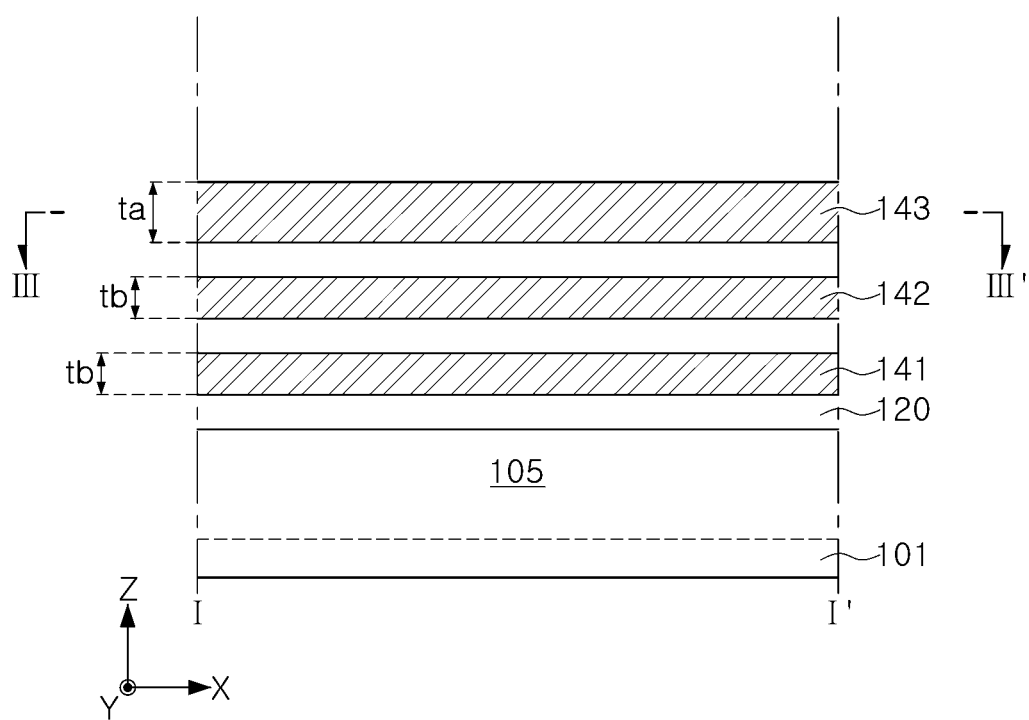
FIGS. 8A to 14C are views that illustrate a process sequence of a method of manufacturing a semiconductor device according to example embodiments.
Figure 8B:
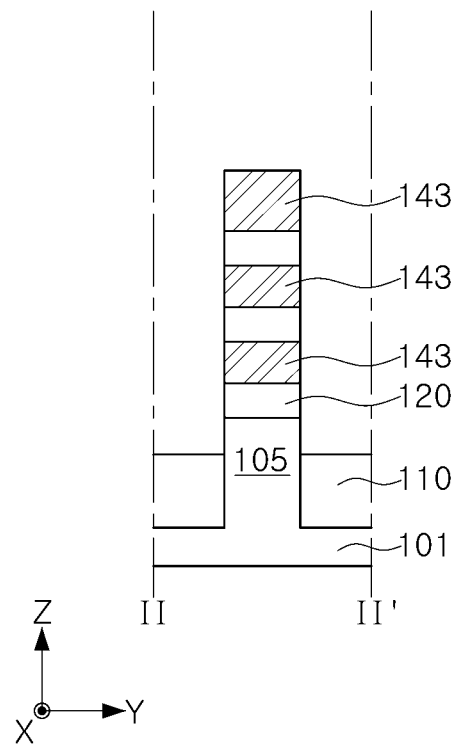
Figure 8C:
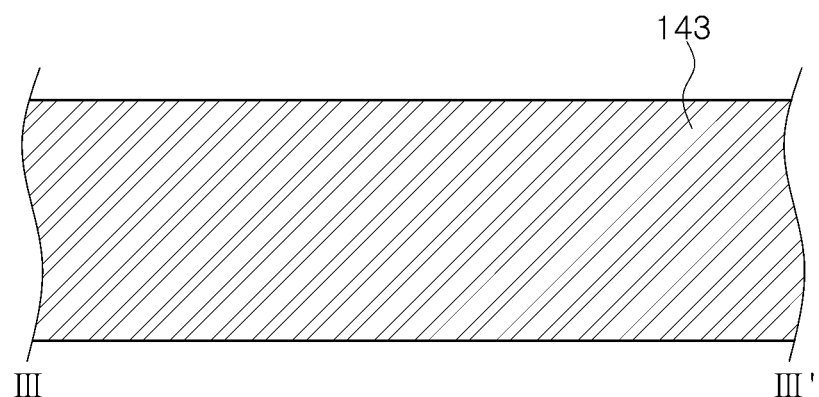

FIGS. 8A and 8B illustrate a method of manufacturing the semiconductor device of FIG. 1 in cross-sections corresponding to cross-sections taken along cutting lines I-I' and II-II', respectively. FIG. 8C illustrates a horizontal cross-section taken along line III-III' of FIG. 8A.

Referring to FIGS. 8A to 8C, sacrificial layers 120 and a plurality of semiconductor layers 141, 142, and 143 may be alternately stacked on a substrate 101. Next, a stack structure of the sacrificial layers 120 and the plurality of semiconductor layers 141, 142, and 143 and a portion of the substrate 101 may be removed to form active structures.

The sacrificial layers 120 may replaced by the gate dielectric layer 161 and the gate electrode 165 as shown in FIG. 2A through a subsequent process. The sacrificial layers 120 may be formed between the substrate 101 and the first semiconductor layer 141, between the first semiconductor layer 141 and the second semiconductor layer 142, and between the second semiconductor layer 142 and the third semiconductor layers 143. The sacrificial layers 120 may include a material having etch selectivity with respect to the semiconductor layers 141, 142, and 143. The semiconductor layers 141, 142, and 143 may include a material that is different from that of the sacrificial layers 120. The sacrificial layers 120 and the plurality of semiconductor layers 141, 142, and 143 may include, for example, a semiconductor material including at least one of silicon (Si), silicon germanium (SiGe), and germanium (Ge), but include different materials, and may or may not include impurities. For example, the sacrificial layers 120 may include silicon germanium (SiGe), and the semiconductor layers 141, 142, and 143 may include silicon (Si).

The sacrificial layers 120 and the plurality of semiconductor layers 141, 142, and 143 may be formed by performing an epitaxial growth process using the substrate 101 as a seed. Each of the sacrificial layers 120 and the semiconductor layers 141, 142, and 143 may have a thickness of about 1 Å to 100 nm. A thickness to of the third semiconductor layer 143 disposed on the top of the plurality of semiconductor layers 141, 142, and 143 may be greater than a thickness tb of each of the first and second semiconductor layers 141 and 142 disposed below the third semiconductor layer 143. By forming the third semiconductor layer 143 to have a relatively large thickness, it is possible to prevent deterioration of electrical characteristics of the semiconductor device due to a thickness loss of the uppermost semiconductor layer occurring in an etching process described with reference to FIG. 10A. The number of layers of the plurality of semiconductor layers 141, 142, and 143 alternately stacked with the sacrificial layer 120 may be variously changed in some example embodiments.

The active structure may include sacrificial layers 120 and a plurality of semiconductor layers 141, 142, and 143 that are alternately stacked each other, and may further include an active region 105 that protrudes from the upper surface of the substrate 101 by removing a portion of the substrate 101. The active structures may be formed in a line shape extending in one direction, for example, extending longwise in the x-direction, and may be spaced apart from each other in the y-direction.

Device isolation layers 110 may be formed in a region from which the portion of the substrate 101 is removed by filling an insulating material in the removed region and then recessing the same such that the active region 105 protrudes. An upper surface of the device isolation layers 110 may be formed to be lower than an upper surface of the active region 105.

Figure 9A:
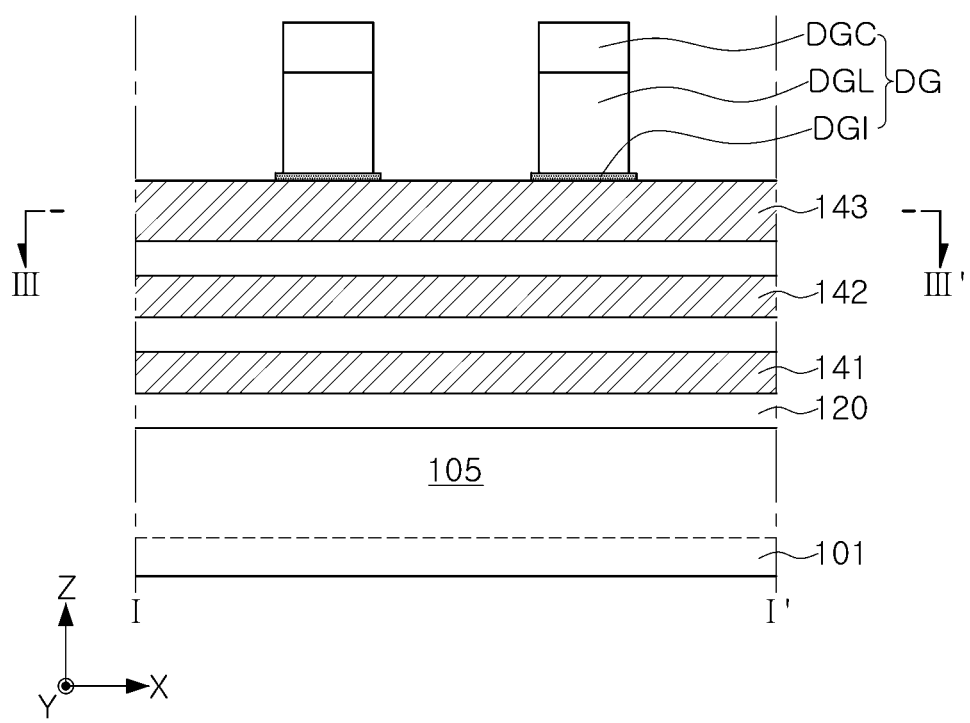
Figure 9B:
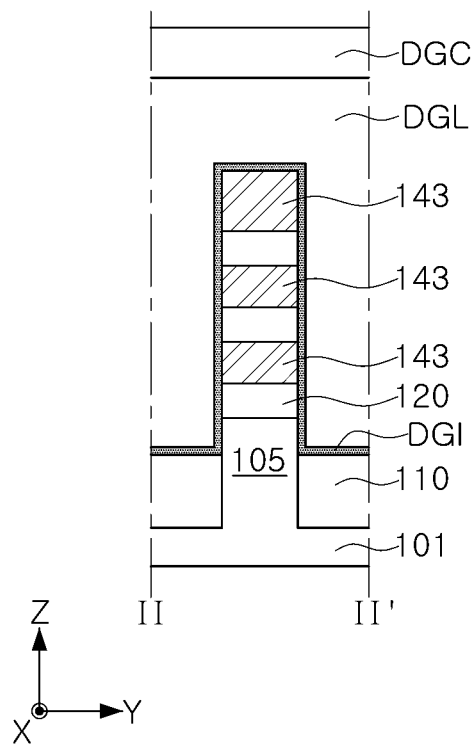
Figure 9C:
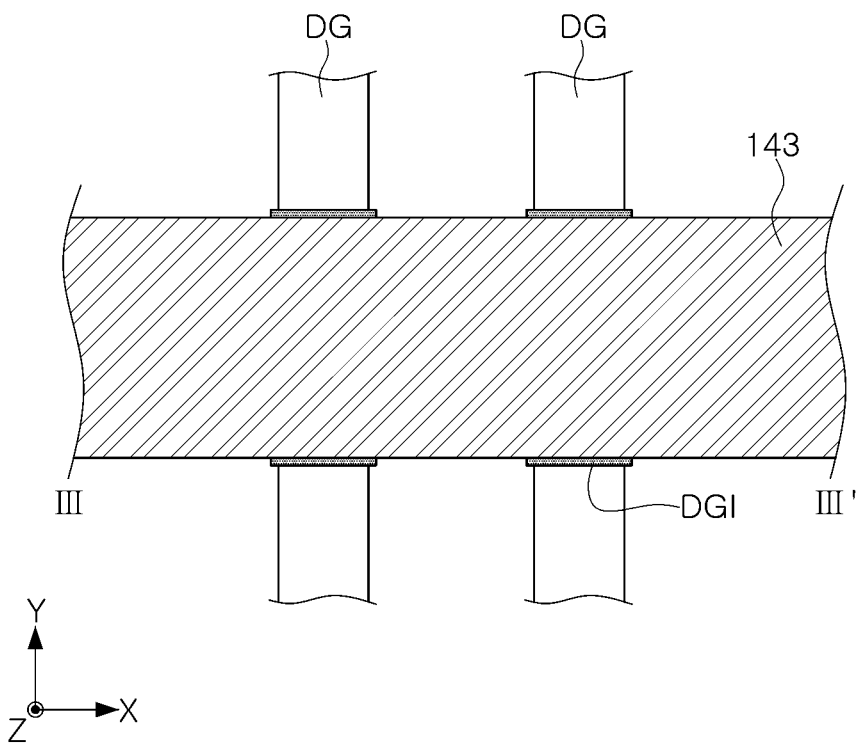

FIGS. 9A and 9B illustrate a manufacturing method of the semiconductor device of FIG. 1 in cross-sections corresponding to cross-sections taken along cutting lines I-I' and II-II', respectively. FIG. 9C illustrates a horizontal cross-section taken along line III-III' of FIG. 9A.

Referring to FIGS. 9A to 9C, sacrificial gate structures DG may be formed on the active structures.

The sacrificial gate structures DG may be formed in a region in which the gate dielectric layer 161 and the gate electrode 165 are disposed above the plurality of semiconductor layers 140 through a subsequent process, as shown in FIG. 2A. The sacrificial gate structure DG may include a sacrificial gate insulating layer DGI, a sacrificial gate layer DGL, and a sacrificial gate capping layer DGC that are sequentially stacked.

The sacrificial gate layer DGL may include or be made of, for example, polysilicon, and the sacrificial gate capping layer DGC may include or be made of a silicon nitride film. The sacrificial gate insulating layer DGI may include or be made of a material having an etch selectivity to the sacrificial gate layer DGL, and may be, for example, one of a thermal oxide, a silicon oxide, and a silicon nitride.

The sacrificial gate insulating layer DGI may have a sidewall that protrudes outwardly of a sidewall of a dummy gate structure DG. A sidewall of the sacrificial gate insulating layer DGI may protrude further than a sidewall of the sacrificial gate layer DGL and a sidewall of the sacrificial gate capping layer DGC. The sacrificial gate insulating layer DGI may include a sidewall protruding portion that protrudes outwardly of the sidewall of the sacrificial gate layer DGL.

Figure 10A:
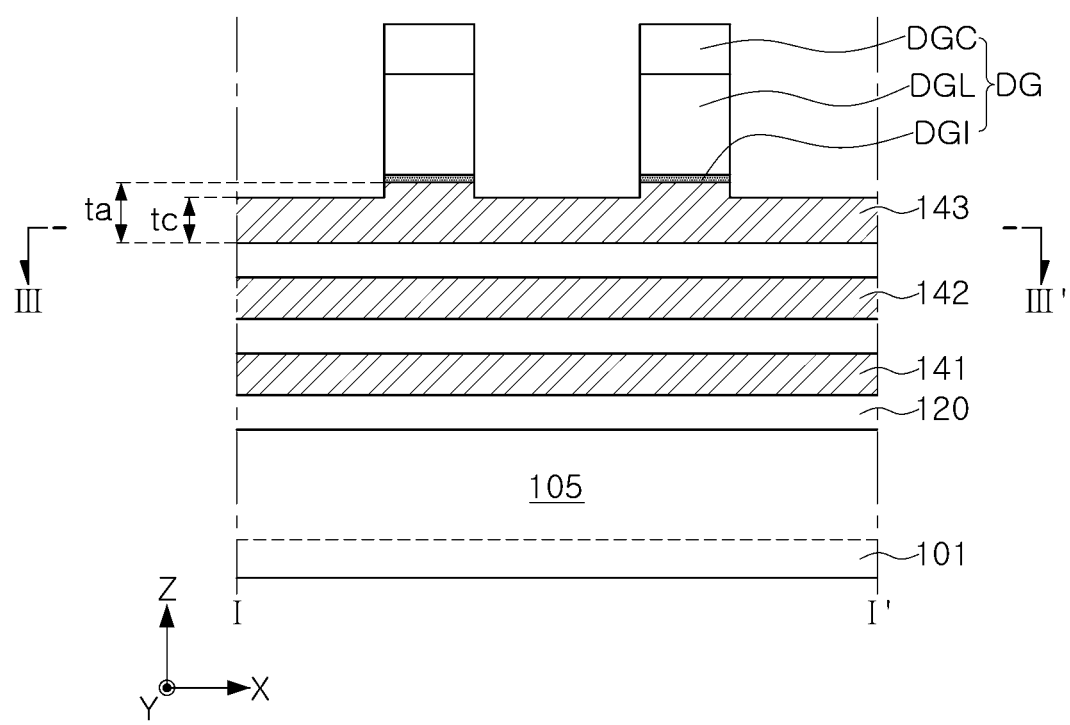
Figure 10B:
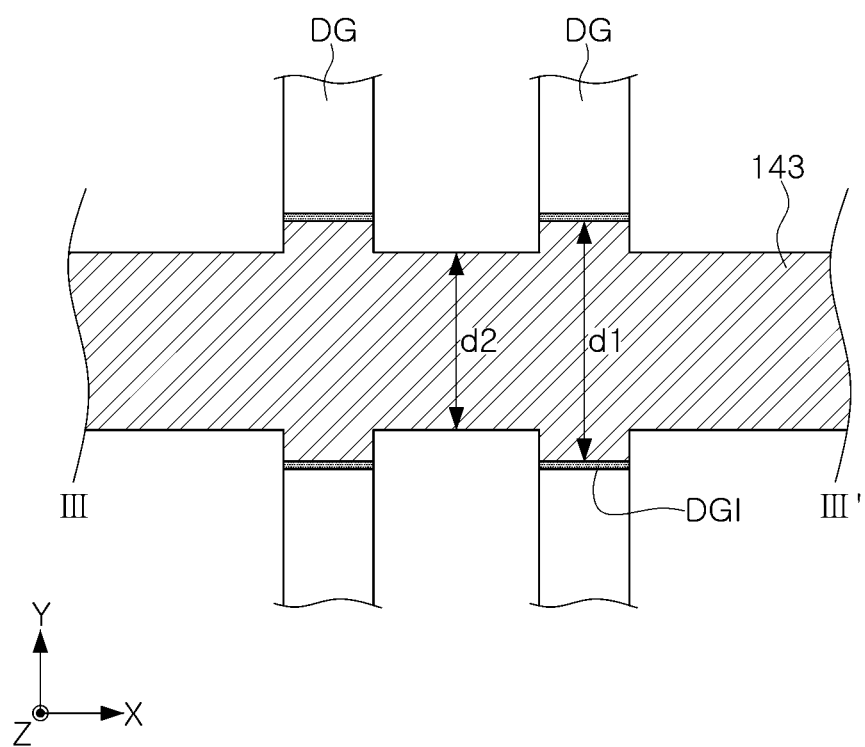

FIG. 10A illustrates a method of manufacturing the semiconductor device of FIG. 1 in a cross-section corresponding to a cross-section taken along the cutting line I-I'. FIG. 10B illustrates a horizontal cross-section taken along line III-III' of FIG. 10A.

Referring to FIGS. 10A and 10B, an etching process for removing the protruding sidewall portion of the sacrificial gate insulating layer DGI may be performed. Since the protruding portion of the sacrificial gate insulating layer DGI is removed, defects such as an unwanted connection between the source/drain region 150 and the dummy gate layer DGL may be prevented from occurring in a manufacturing process. For example, the removal of the protruding portion of the sacrificial gate insulating layer DGI may prevent electrical short circuits.

As shown in FIG. 10A, the sidewall of the sacrificial gate insulating layer DGI may be formed so as not to be recessed inwardly from the sidewall of the sacrificial gate layer DGL, so that the spacer structure 170 formed in a subsequent process might not be disposed between the gate structure 160 and the uppermost semiconductor layer 143. For example, the sidewall of the sacrificial gate insulating layer DGI may be substantially coplanar with the sacrificial gate layer DGL by an etching process, but is not necessarily limited thereto.

A portion of the third semiconductor layer 143 may be removed together by an etching process of the sacrificial gate insulating layer DGI.

A portion of the third semiconductor layer 143 may be removed in a region that does not overlap the sacrificial gate structure DG, so that as shown in FIG. 10A, a portion of the thickness of the third semiconductor layer 143 may be reduced. A thickness ta of a portion of the third semiconductor layer 143 that overlaps the sacrificial gate structure DG may be greater than a thickness tb of a portion not overlapping the sacrificial gate structure DG. In addition, as shown in FIG. 10B, portions having different widths of the third semiconductor layer 143 may be formed. For example, as shown in the horizontal cross-section of FIG. 10B, a width d1 of the third semiconductor layer 143 in the region overlapping the sacrificial gate structure DG may be greater than a width d2 of the third semiconductor layer 143 in the region not overlapping the sacrificial gate structure DG.

Figure 11A:
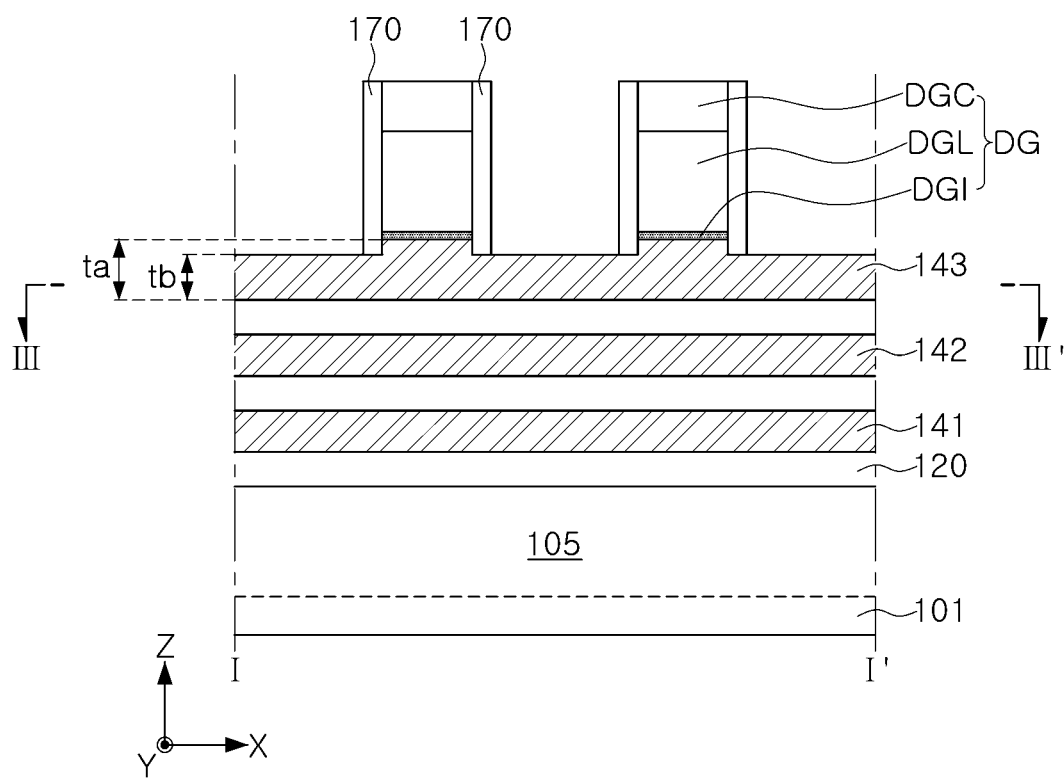
Figure 11B:
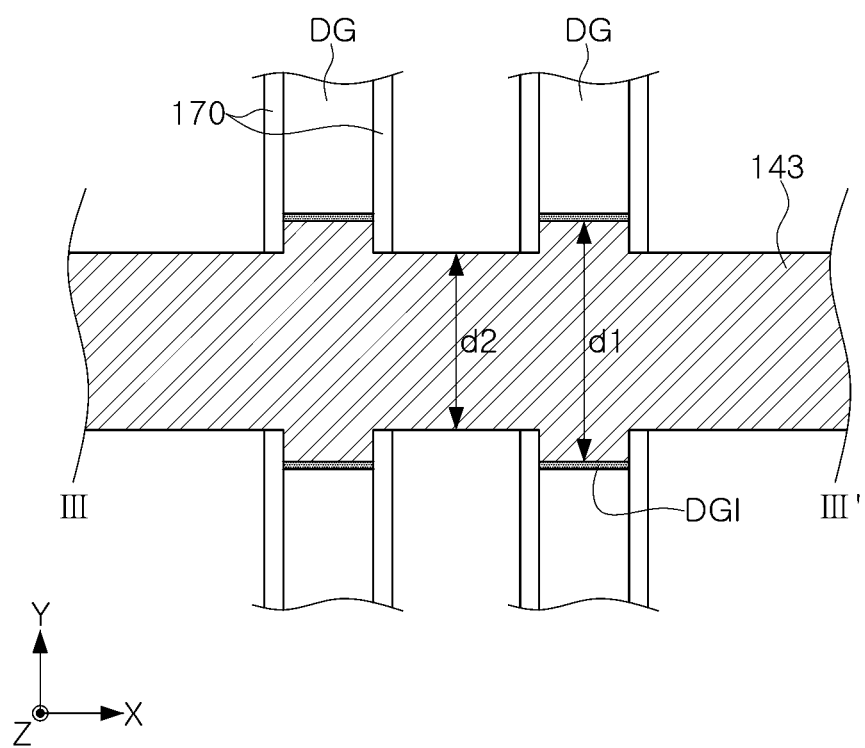

FIG. 11A illustrates a manufacturing method of the semiconductor device of FIG. 1 in a cross-section corresponding to a cross-section taken along the cutting line I-I'. FIG. 11B illustrates a horizontal cross-section taken along line III-III' of FIG. 11A.

Referring to FIGS. 11A and 11B, spacer structures 170 may be formed on both sidewalls of the sacrificial gate structures DG on the active structures (e.g., both sides in the X-direction).

As shown in FIG. 11A, the spacer structure 170 may be disposed on both sides of a portion with a relatively thick thickness ta in the third semiconductor layer 143. A lower surface of the spacer structure 170 may be disposed lower than a lower surface of the sacrificial gate insulating layer DGI. The spacer structure 170 may contact a side surface of the sacrificial gate insulating layer DGI. The spacer structure 170 may be disposed on both sides of a portion having a relatively large width d1 in the third semiconductor layer 143, as shown in the horizontal cross-section of FIG. 11B.

The spacer structure 170 may be formed by disposing a film having a uniform thickness along upper and side surfaces of the sacrificial gate structures DG and the active structures and then performing anisotropic etching. The spacer structure 170 may include, for example, at least one of SiO, SiN, SiCN, SiOC, SiON, and SiOCN.

Figure 12A:
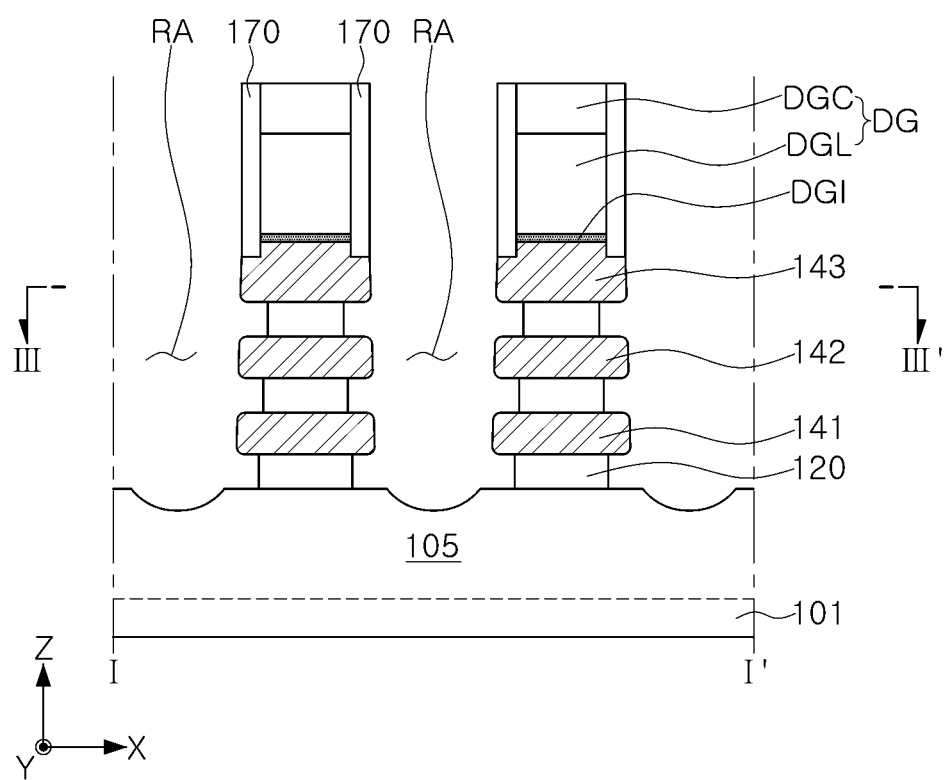
Figure 12B:
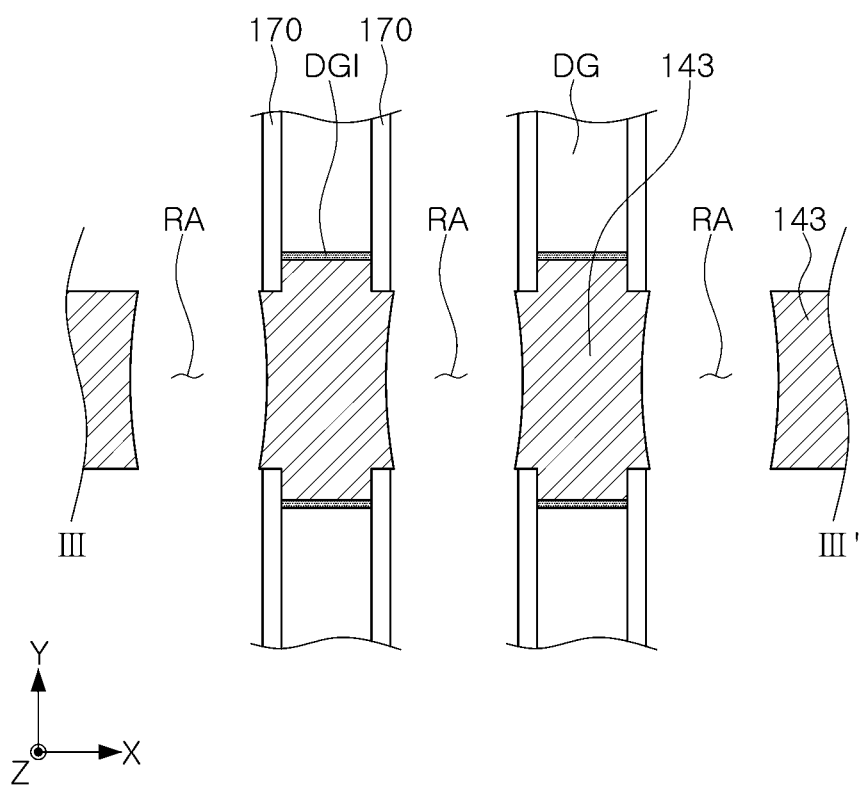

FIG. 12A illustrates a method of manufacturing the semiconductor device of FIG. 1 in a cross-section corresponding to a cross-section taken along the cutting line I-I'. FIG. 12B shows a horizontal cross-section taken along line III-III' of FIG. 12A.

Referring to FIGS. 12A and 12B, a recess portion RA may be formed by removing the exposed sacrificial layers 120 and the plurality of semiconductor layers 141, 142, and 143 between the sacrificial gate structures DG. The sacrificial layers 120 exposed by the recess portion RA may be partially removed from a side surface thereof.

The exposed sacrificial layers 120 and the plurality of semiconductor layers 141, 142, and 143 may be removed by using the sacrificial gate structures DG and the spacer structures 170 as masks.

The sacrificial layers 120 may be selectively etched with respect to the plurality of semiconductor layers 140 by, for example, a wet etching process, and may be partially removed from the side surface thereof along the X-direction. The sacrificial layers 120 may have inwardly concave side surfaces by side etching as described above. However, the shape of the side surfaces of the sacrificial layers 120 is not necessarily limited those illustrated in the Figures. In an example embodiment, while a portion of the side surfaces of the sacrificial layers 120 are removed, portions of the plurality of semiconductor layers 141, 142, and 143 may be removed together to have a curved shape.

Figure 13A:
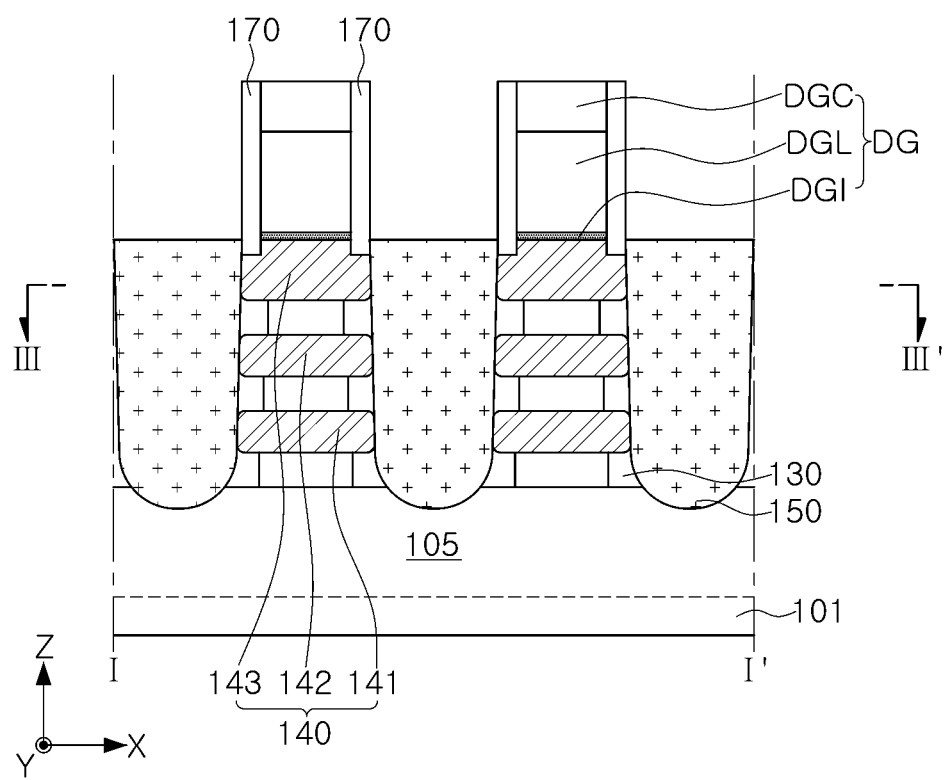
Figure 13B:
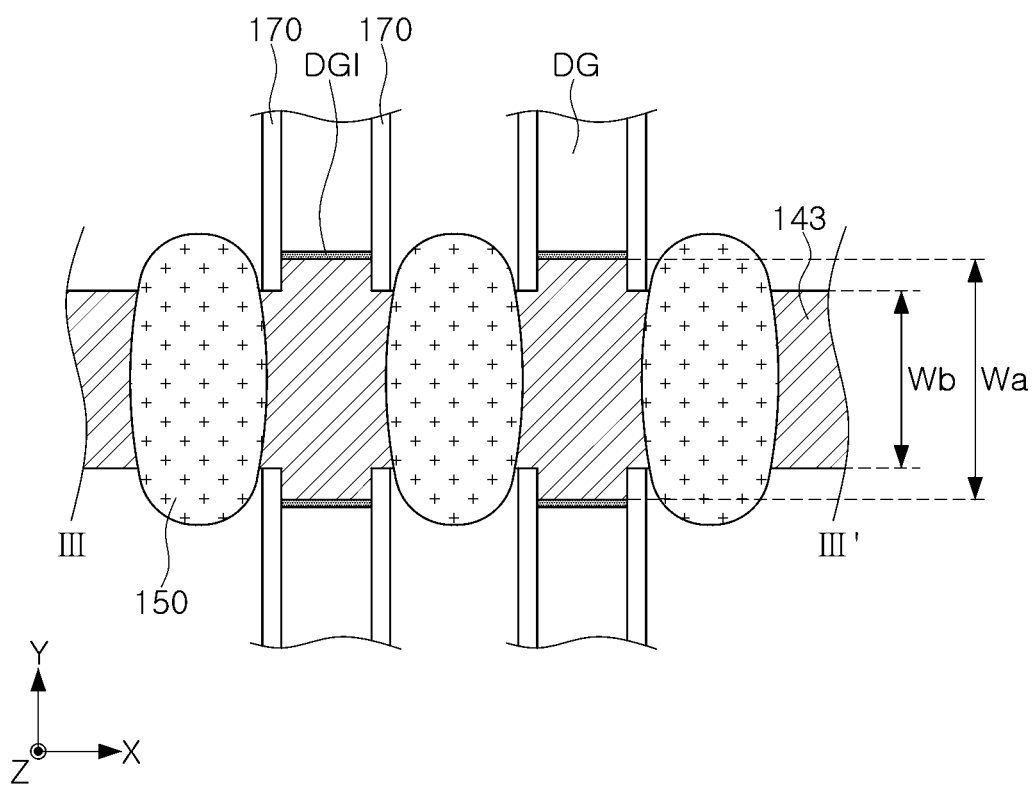

FIG. 13A illustrates a method of manufacturing the semiconductor device of FIG. 1 in a cross-section corresponding to a cross-section taken along the cutting line I-I'. FIG. 13B illustrates a horizontal cross-section taken along line III-III' of FIG. 13A.

Referring to FIGS. 13A and 13B, internal spacer layers 130 may be formed in a region in which the sacrificial layers 120 are partially removed from a side surface thereof. However, an operation of partially removing the sacrificial layers 120 and forming the internal spacer layers 130 may be omitted in some example embodiments. Source/drain regions 150 may be formed on the active region 105 on both sides of the sacrificial gate structures DG.

The internal spacer layers 130 may be formed by filling an insulating material in a region from which the sacrificial layers 120 are partially removed, and then removing the insulating material deposited on an outside of the plurality of semiconductor layers 140. The internal spacer layers 130 may be formed of the same material as the spacer structures 164, but are not necessarily limited thereto. For example, the internal spacer layers 130 may include at least one of SiN, SiCN, SiOCN, SiBCN, and SiBN.

The source/drain regions 150 may be formed by performing an epitaxial growth process in a recess portion RA. The upper surfaces of the source/drain regions 150 may be disposed at a higher level than the upper surface of the third semiconductor layer 143, but the present disclosure is not necessarily limited thereto. The source/drain regions 150 may include impurities by in-situ doping, and may also include a plurality of layers having different doping elements and/or doping concentrations.

As shown in FIG. 13B, in a horizontal cross-section, a width Wb may be less than a width Wa. The width Wb may be a width of a surface of a third semiconductor layer 143 in the Y-direction which contacts a source/drain region 150. The width Wa may be a width of a third semiconductor layer 143 in a region overlapping the dummy gate structure DG.

Figure 14A:
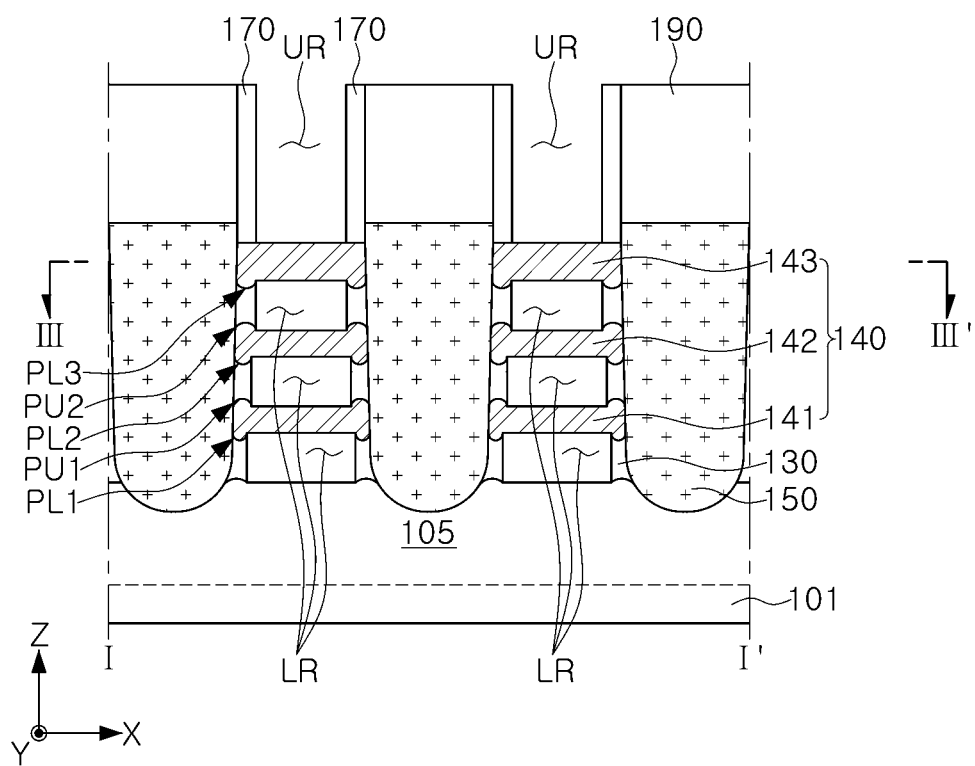
Figure 14B:
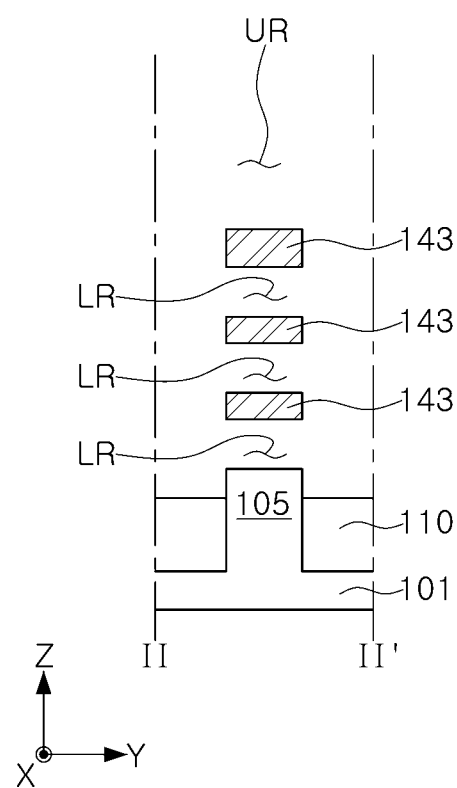
Figure 14C:
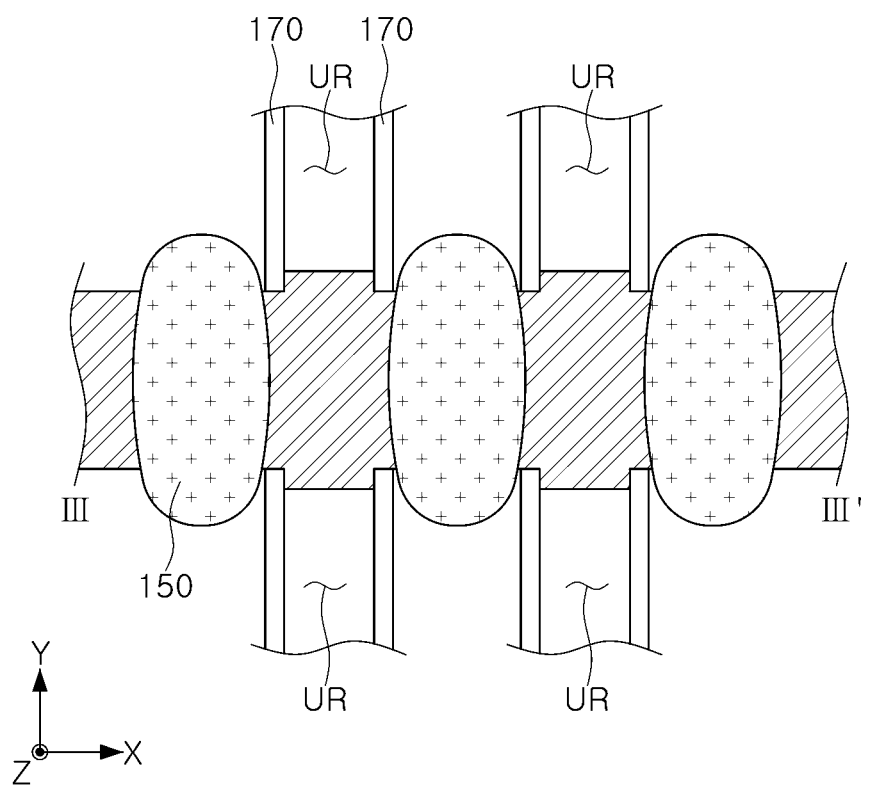

FIGS. 14A and 14B illustrate a method of manufacturing the semiconductor device of FIG. 1 in cross-sections taken along cutting lines I-I' and II-II', respectively. FIG. 14C illustrates a horizontal cross-section taken along the cutting line III-III' of FIG. 14A.

Referring to FIGS. 14A to 14C, an interlayer insulating layer 190 may be formed on the source/drain regions 150, and sacrificial gate structures DG and the sacrificial layers 120 may be removed.

The interlayer insulating layer 190 may be partially formed by forming an insulating film covering sacrificial gate structures DG and the source/drain regions 150 and performing a planarization process such that an upper surface of a sacrificial gate capping layer DGC is exposed.

The sacrificial gate structures DG and the sacrificial layers 120 may be selectively removed with respect to the spacer structure 170, the interlayer insulating layer 190, and the plurality of semiconductor layers 140. First, the sacrificial gate structures DG may be removed to form upper gap regions UR, and then the sacrificial layers 120 exposed through the upper gap regions UR may be removed to form lower gap regions LR. When the sacrificial gate structures DG are removed, a portion of an upper surface of a third semiconductor layer 143 may be removed together. Accordingly, the upper surface of the third semiconductor layer 143 may be flat, but is not necessarily limited thereto. For example, the upper surface of the third semiconductor layer 143 may include a portion that protrudes upwardly. When the lower gap regions LR are formed, a portion of the first to third semiconductor layers 141, 142, and 143 may be removed together. Accordingly, protrusions PL3 of the third semiconductor layer 143, lower surface protrusions PL1 and PL2 and upper protrusions PU1 and PU2 of the first and second semiconductor layers 141 and 142 may be formed through, for example, a selective etching process. For example, when the sacrificial layers 120 include silicon germanium (SiGe), and when the plurality of semiconductor layers 140 include silicon (Si), the sacrificial layers 120 may be selectively removed by performing a wet etching process using peracetic acid as an etchant.

Next, referring to FIG. 2A to 3 together, a gate dielectric layer 161 and a gate electrode 165 may be formed in upper gap regions UR and lower gap regions LR. The gate dielectric layers 161 may be formed to conformally cover inner surfaces of the upper gap regions UR and the lower gap regions LR. After the gate electrodes 165 are formed to completely fill the upper gap regions UR and the lower gap regions LR, the gate electrodes 165 may be removed from above the upper gap regions UR to a predetermined depth. A gate capping layer 166 may be formed in a region in which the gate electrodes 165 are removed from the upper gap regions UR. Accordingly, gate structures 160 including the gate dielectric layer 161, the gate electrode 165, and the gate capping layer 166 may be formed. An interlayer insulating layer 190 may be additionally formed. A contact structure 180 penetrating through the interlayer insulating layer 190 and connected to the source/drain regions 150 may be formed between the gate structures 160.

As set forth above, according to an example embodiment of the present disclosure, an occurrence of defects in a manufacturing process of a semiconductor device such as an unwanted connection between a source/drain region and a dummy gate layer, or the like, may be prevented.

In an example embodiment, a thickness of an uppermost semiconductor layer among the plurality of semiconductor layers may be increased to prevent deterioration of characteristics in the manufacturing process of the semiconductor device. For example, a semiconductor according to the structures and process methods disclosed herein may operate with increased reliability and with decreased shorts.

The various effects of the present disclosure are not necessarily limited to the above description, and may be more easily understood in the course of describing the specific embodiments of the present disclosure.

While example embodiments have been shown and described above, it will be apparent to those skilled in the art that modifications and variations could be made without departing from the scope of the present disclosure as defined by the appended claims.

What is claimed is:

1. A semiconductor device, comprising:
an active region extending on a substrate in a first direction;
a plurality of semiconductor layers spaced apart from each other vertically on the active region, wherein the plurality of semiconductor layers includes a lower semiconductor layer and an uppermost semiconductor layer disposed above the lower semiconductor layer, wherein a vertical thickness of the uppermost semiconductor layer is greater than that of the lower semiconductor layer;
a gate structure extending on the substrate in a second direction that is perpendicular to the first direction, wherein the gate structure includes a gate electrode at least partially surrounding each of the plurality of semiconductor layers;
a spacer structure disposed on both sidewalls of the gate structure; and
source/drain regions disposed on the active region on both sides of the gate structure, wherein the source/drain regions contact the plurality of semiconductor layers,
wherein each of the plurality of semiconductor layers includes a first portion overlapping the gate structure and second portions disposed on both sides of the first portion and overlapping the spacer structure, and
wherein a first width of the first portion in the second direction is greater than a second width of each of the second portions.

2. The semiconductor device of claim 1, wherein the first portion contacts gate structure, and
wherein the second portions contact the spacer structure.

3. The semiconductor device of claim 1, wherein the second portions have a first surface that contacts the source/drain regions.

4. The semiconductor device of claim 3, wherein the first portion comprises second surfaces opposed in the second direction, and
wherein each of the plurality of semiconductor layers further comprises a corner bent portion connecting each of the second surfaces and the first surface, the corner bent portion being in contact with the spacer structure.

5. The semiconductor device of claim 1, wherein an upper surface of the uppermost semiconductor layer is substantially flat, and
wherein a lower surface of the uppermost semiconductor layer comprises a first lower surface protrusion protruding in a direction toward the substrate.

6. The semiconductor device of claim 5, wherein a lower surface of the lower semiconductor layer comprises a second lower surface protrusion protruding in a direction toward the substrate, and
wherein an upper surface of the lower semiconductor layer has an upper surface protrusion protruding in a direction toward the uppermost semiconductor layer.

7. The semiconductor device of claim 1, further comprising internal spacer layers disposed on a lower surface of each of the plurality of semiconductor layers on both sides of the gate structure in the first direction.

8. The semiconductor device of claim 7, wherein the internal spacer layers comprise a portion recessed from the upper surface of the gate structure in the first direction.

9. The semiconductor device of claim 1, wherein a maximum width of the source/drain regions in the second direction is greater than the first width.

10. The semiconductor device of claim 1, wherein each of the source/drain regions comprises a first epitaxial region and a second epitaxial region disposed on the first epitaxial region,
wherein the first epitaxial region is in contact with the second portions of the plurality of semiconductor layers, and
wherein a maximum width of the second epitaxial region in the second direction is greater than the second width.

11. The semiconductor device of claim 1, wherein a lower surface of the gate structure contacts the entirety of the uppermost semiconductor layer.

12. A semiconductor device, comprising:
an active region extending on a substrate in a first direction;
a plurality of semiconductor layers spaced apart from each other vertically on the active region;
a gate structure extending on the substrate in a second direction, perpendicular to the first direction, and including a gate electrode at least partially surrounding each of the plurality of semiconductor layers; and
source/drain regions disposed on the active region on at least opposite sides of the gate structure in the first direction, wherein the source/drain regions contact the plurality of semiconductor layers,
wherein each of the plurality of semiconductor layers includes a first surface contacting the source/drain regions, and
wherein each of the plurality of semiconductor layers has a first width in the second direction in a region overlapping the gate structure, and wherein the first surface of the plurality of semiconductor layers has a second width that is narrower than the first width in the second direction.

13. The semiconductor device of claim 12, wherein each of the plurality of semiconductor layers comprises second surfaces contacting the gate structure and opposing each other in the second direction, and comprises corner bent portions connecting each of the first and second surfaces.

14. The semiconductor device of claim 13, further comprising a spacer structure extending in the second direction on both sides of the gate structure,
wherein the spacer structure contacts the corner bent portion.

15. The semiconductor device of claim 12, wherein an upper surface of an uppermost semiconductor layer among the plurality of semiconductor layers is substantially flat, and
wherein a lower surface of the uppermost semiconductor layer comprises a protrusion protruding in a direction toward the substrate.

16. The semiconductor device of claim 15, wherein a lower semiconductor layer disposed below the uppermost semiconductor layer comprises a first portion overlapping the gate structure and having a first thickness, and further comprises second portions respectively having a second thickness on both sides of the first portion, and
wherein the second thickness is greater than the first thickness.

17. A semiconductor device, comprising:
an active region extending on a substrate in a first direction;
a plurality of semiconductor layers spaced apart from each other vertically on the active region;
a gate structure extending in a second direction that is perpendicular to the first direction on the substrate, wherein the gate structure includes a gate electrode at least partially surrounding each of the plurality of semiconductor layers;
a spacer structure disposed on both sidewalls of the gate structure; and
source/drain regions disposed on the active region on both sides of the gate structure, and contacting the plurality of semiconductor layers,
wherein an upper surface of an uppermost semiconductor layer among the plurality of semiconductor layers is substantially flat,
wherein an upper surface of a lower semiconductor layer disposed below the uppermost semiconductor layer includes an upper surface protrusion protruding in a direction toward the uppermost semiconductor layer,
wherein a lower surface of the uppermost semiconductor layer comprises a first lower surface protrusion protruding towards the substrate, and
wherein a portion of the spacer structure is disposed between the upper surface protrusion of the lower semiconductor layer and the first lower surface protrusion of the uppermost semiconductor layer.

18. The semiconductor device of claim 17,
wherein a lower surface of the lower semiconductor layer comprises a second lower surface protrusion protruding toward the substrate.

19. The semiconductor device of claim 17, wherein a thickness of the uppermost semiconductor layer is greater than a thickness of the lower semiconductor layer.

20. The semiconductor device of claim 17, wherein the uppermost semiconductor layer and the lower semiconductor layer have substantially the same thickness.

* * * * *